United States Patent
Humphreys et al.

(10) Patent No.: US 7,656,963 B2
(45) Date of Patent: *Feb. 2, 2010

(54) DATA TRANSFER USING FREQUENCY NOTCHING OF RADIO-FREQUENCY SIGNALS

(75) Inventors: David A. Humphreys, San Diego, CA (US); Gerald D. Rogerson, Poway, CA (US)

(73) Assignee: General Atomics, San Diego, CA (US)

( * ) Notice: Subject to any disclaimer, the term of this patent is extended or adjusted under 35 U.S.C. 154(b) by 162 days.

This patent is subject to a terminal disclaimer.

(21) Appl. No.: 11/669,027

(22) Filed: Jan. 30, 2007

(65) Prior Publication Data

US 2007/0121756 A1 May 31, 2007

Related U.S. Application Data

(63) Continuation of application No. 10/255,084, filed on Sep. 26, 2002, now Pat. No. 7,177,368.

(60) Provisional application No. 60/326,028, filed on Sep. 26, 2001, provisional application No. 60/326,093, filed on Sep. 26, 2001.

(51) Int. Cl.
*H04L 27/00* (2006.01)

(52) U.S. Cl. .................................. 375/295

(58) Field of Classification Search ............... 375/295, 375/296; 327/291; 341/20, 173; 455/42
See application file for complete search history.

(56) References Cited

U.S. PATENT DOCUMENTS

| | | |
|---|---|---|
| 4,655,547 A | 4/1987 | Heritage et al. |
| 4,746,193 A | 5/1988 | Heritage et al. |
| 4,866,699 A | 9/1989 | Brackett et al. |
| 4,928,316 A | 5/1990 | Heritage et al. |
| 5,132,824 A | 7/1992 | Patel et al. |
| 5,166,818 A | 11/1992 | Chase et al. |
| 5,367,536 A | 11/1994 | Tsujimoto |
| 5,790,516 A | 8/1998 | Gudmundson et al. |
| 5,815,537 A | 9/1998 | Janssen |
| 5,886,808 A | 3/1999 | Skeldon et al. |
| 6,026,125 A | 2/2000 | Larrick, Jr. et al. |
| 6,072,340 A | 6/2000 | Deisch |
| 6,097,859 A | 8/2000 | Solgaard et al. |
| 6,338,037 B1 | 1/2002 | Todd et al. |
| 6,570,394 B1 | 5/2003 | Williams |
| 6,853,687 B2 | 2/2005 | Harrington et al. |
| 6,868,101 B1 | 3/2005 | Lowenhar et al. |
| 7,177,368 B2 * | 2/2007 | Humphreys et al. ......... 375/295 |
| 2002/0191690 A1 | 12/2002 | Pendergrass et al. |
| 2003/0071617 A1 | 4/2003 | Kruspe et al. |

* cited by examiner

*Primary Examiner*—Don N Vo
(74) *Attorney, Agent, or Firm*—Fitch Even Tabin & Flannery

(57) ABSTRACT

A method for data transmission includes forming a notched radio-frequency (RF) burst according to one or more data values, where a bandwidth of the notched RF burst is at least two percent of the center frequency of the notched RF burst. Forming a notched RF pulse includes altering, according to the data, at least one of the amplitude and phase of one or more selected components, where each of the selected components has a bandwidth within the bandwidth of the notched RF burst.

13 Claims, 36 Drawing Sheets

DATA TRANSFER USING FREQUENCY NOTCHING OF RADIO-FREQUENCY SIGNALS

RELATED APPLICATIONS

This application is a continuation of U.S. application Ser. No. 10/255,084 ("DATA TRANSFER USING FREQUENCY NOTCHING OF RADIO-FREQUENCY SIGNALS"), filed Sep. 26, 2002, now U.S. Pat. No. 7,177,368, which claims priority to U.S. Provisional Patent Application Nos. 60/326,028 ("COMMUNICATIONS SYSTEM USING INFORMATION ENCODED BY FREQUENCY NOTCHING IN RF ULTRAWIDEBAND PULSES," filed Sep. 26, 2001); and 60/326,093 ("FREQUENCY SHIFT KEYING WITH ULTRA WIDEBAND PULSES," filed Sep. 26, 2001), all of which are incorporated herein by reference.

BACKGROUND

1. Field of the Invention

This invention relates to data transfer over wired and/or wireless transmission channels.

2. Background Information

As computing and communications applications become richer and more complex, it becomes desirable to support transfers of data between devices at higher and higher rates. At the same time, it may be desirable to obtain high performance with respect to other criteria such as power consumption, cost, and robustness to interference. The increasing popularity of consumer electronics, computing, and communicating devices, in various forms (e.g. mobile, hand-held, wearable, and fixed) and possibly with associated peripherals, indicates a clear demand for these types of devices and for connectivity (e.g. peer-to-peer and/or networked) between them. Unfortunately, present-day communications technologies fall short of providing the technical requirements necessary to support such demands.

Wireless connectivity may enable better user experiences and possibly spur an increased demand for such devices. For example, wireless connectivity can provide enhanced capability; is expected to be easier to use; may encompass cost savings and increases in efficiency and productivity; and may increase possible device applications and/or deployments.

Use of such devices may include large data transfers and/or multimedia applications. For example, a cable replacement scenario for a computer, a consumer electronic device, or a similar device may need to support transfers of large amounts of data. Multimedia applications may handle multiple simultaneous streams of high-definition audio and/or video coming from devices such as business/entertainment systems and gateways.

Most existing wireless schemes transfer data via modulated continuous-wave carriers. In many cases, a portion of the radio-frequency spectrum is reserved for the exclusive use of the scheme. Such reservations allow these transfer schemes (e.g. commercial radio and TV broadcasts) to operate free of interference from other devices and without interfering with other systems.

Data transfers may be conducted over very narrow frequency bands in an attempt to occupy less of the frequency spectrum. However, such schemes may be more susceptible to increases in background noise level and to multipath interference. Some narrowband schemes may also be more likely to interfere with other systems (e.g. due to a higher concentration of energy in the particular frequency band being used).

Although battery technology is steadily improving, operating times between charges is still an important factor in the design of portable devices. Complexity and cost of transmitter and receiver implementations are other important factors for consumer applications. Present-day solutions offer only a few of the necessary technical requirements. For example, some may provide low cost and low power consumption but only at low bit rate, while others may have higher bit rates but be unacceptable in terms of cost and/or rate of power consumption.

It is desirable to support high rates of data transfer. It may also be desirable for a scheme that supports high, medium, and/or low rates of data transfer to obtain one or more advantages such as 1) low power consumption, 2) low cost of implementation, and/or 3) an ability to coexist with interferers and/or with other frequency use. Other desirable advantages may include scalability with potential capability for backwards compatibility and/or an ability to determine position and/or location.

Additionally, it may be desirable in certain situations (e.g. military) to reduce jamming susceptibility and/or the probability of detection and/or intercept.

SUMMARY OF THE INVENTION

A method for data transmission includes forming a notched radio-frequency (RF) burst according to one or more data values, where a bandwidth of the notched RF burst is at least two percent of the center frequency of the notched RF burst. Forming a notched RF pulse includes altering, according to the data, at least one of the amplitude and phase of one or more selected components, where each of the selected components has a bandwidth within the bandwidth of the notched RF burst. Methods of RF data reception and transmitter and receiver configurations are also disclosed.

DETAILED DESCRIPTION

Figure 1:
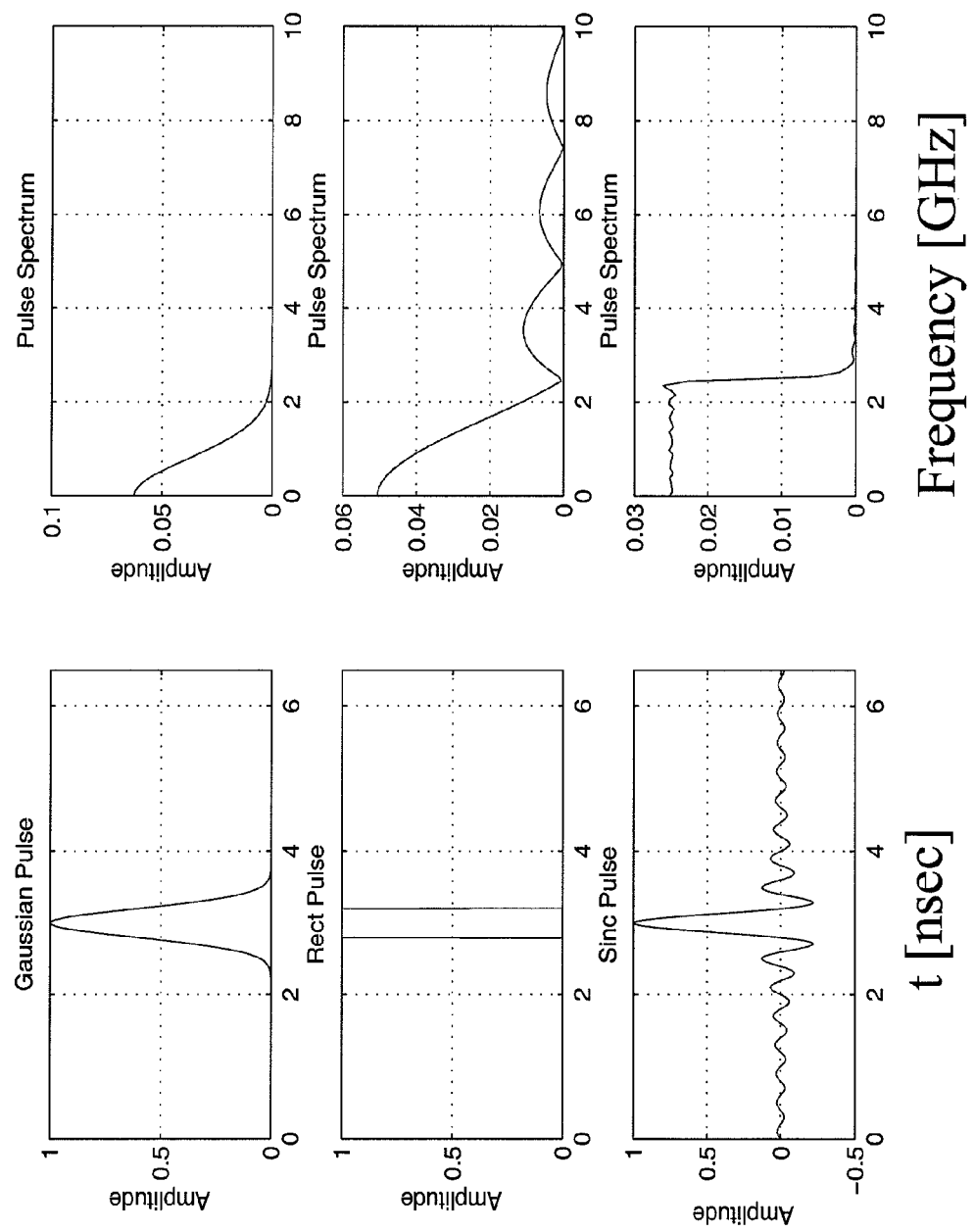
FIG. 1 shows examples of three ultra-wideband pulses and their spectra.

In the description and claims that follow, certain terms may be defined as follows:

The term 'radio-frequency' denotes electromagnetic radiation having a frequency of up to 300 GHz (gigahertz).

The term 'frequency band' denotes a portion of the frequency spectrum. The term 'center frequency' as applied to a frequency band denotes a frequency at the arithmetic mean of the frequencies of the boundaries of the frequency band. As defined herein, frequency bands may be adjacent to one another but are distinct from one another and do not overlap.

The term 'burst' denotes the emission of an amount of energy within a particular range of frequencies and over a limited period of time. A burst may include one or more cycles of a waveform (e.g. a sine wave). A burst may even be limited to less than one cycle of a waveform. In some applications, two or more bursts may be transmitted simultaneously. Transferring a burst from the generating, shaping, or forming circuitry (e.g. as described herein) to the transmission medium or channel is also referred to as 'launching' the burst.

The term 'bandwidth' denotes a continuous range of frequencies that contains at least 90% and not more than 95% of the total energy of a signal. The bandwidth of a burst may lie within more than one frequency band at a time. The term 'center frequency' as applied to a burst denotes the midpoint (along the frequency axis) of the energy distribution of the burst: i.e. the frequency at which the total energy of the burst on either side is fifty percent of the total energy of the burst (as in the examples illustrated in FIG. 59). A burst 'occupies' a frequency band when the center frequency of the burst is within the frequency band, such that a burst occupies no more than one frequency band at a time.

The term 'wideband' denotes a signal whose bandwidth is not less than 2% of its center frequency, and the term 'ultra-wideband' denotes a signal whose bandwidth is not less than 20% of its center frequency. For example, the bandwidth of an ultra-wideband signal may be up to 50% or more of the signal's center frequency. Ultra-wideband signals may be used at radio frequencies from less than tens of hertz to near terahertz. Although most ultra-wideband use currently falls between 100 MHz and 10 GHz primarily due to present-day regulatory allocations, it is envisioned that future allocations will extend far beyond this frequency range.

The term 'pulse' denotes a transient disturbance including a transition from a first amplitude level (e.g. zero) to a second amplitude level (e.g. a maximum) followed by a transition back to the first amplitude level, both transitions occurring within a limited time interval (e.g. on the order of one nanosecond). A pulse may have one of many different shapes, provided the pulse is time-limited. By way of example only and without limitation, a pulse may have a shape that is Gaussian, rectangular, sinc-function, or sinusoidal.

The term 'frequency notching' denotes creation of one or more reductions in magnitude in a spectral profile that are delimited in frequency. For example, frequency notching may be performed by attenuating selected frequency bands (e.g. using band-stop filters). Alternatively, frequency notching may be performed by combining spectral components to produce a signal having a notched spectrum. The term 'notch band' denotes a frequency band corresponding to a notch (i.e. a local attenuation in amplitude or a local change in phase across the band).

Communication by wireless or conductive (e.g. wired) transmission of temporally narrow (ultra-wideband) pulses allows spreading of electromagnetic energy across a wide region of the spectrum. However, it is difficult to encode information in such temporally narrow pulses.

A method according to one embodiment of the invention includes generating a continuous-spectrum burst in the time domain and selectively filtering the burst to notch out portions of its spectrum. If one or more bands in the continuous spectrum are notched out, the burst will remain approximately time-limited (i.e. will have a characteristic width close to the original burst) but will display "resonant" or oscillatory characteristics not present in the original burst.

The burst width can be made precisely time-limited, e.g. by windowing the notched burst in time. Although the notched burst may have a length in time that is longer than that of the original burst, its amplitude will typically decay to a negligible level within a short period of time. If the window is too short, however, the notches of the burst may become more difficult to detect, and a relation between window length and feature distinction should be adopted that is suitable for the particular application.

Figure 2:
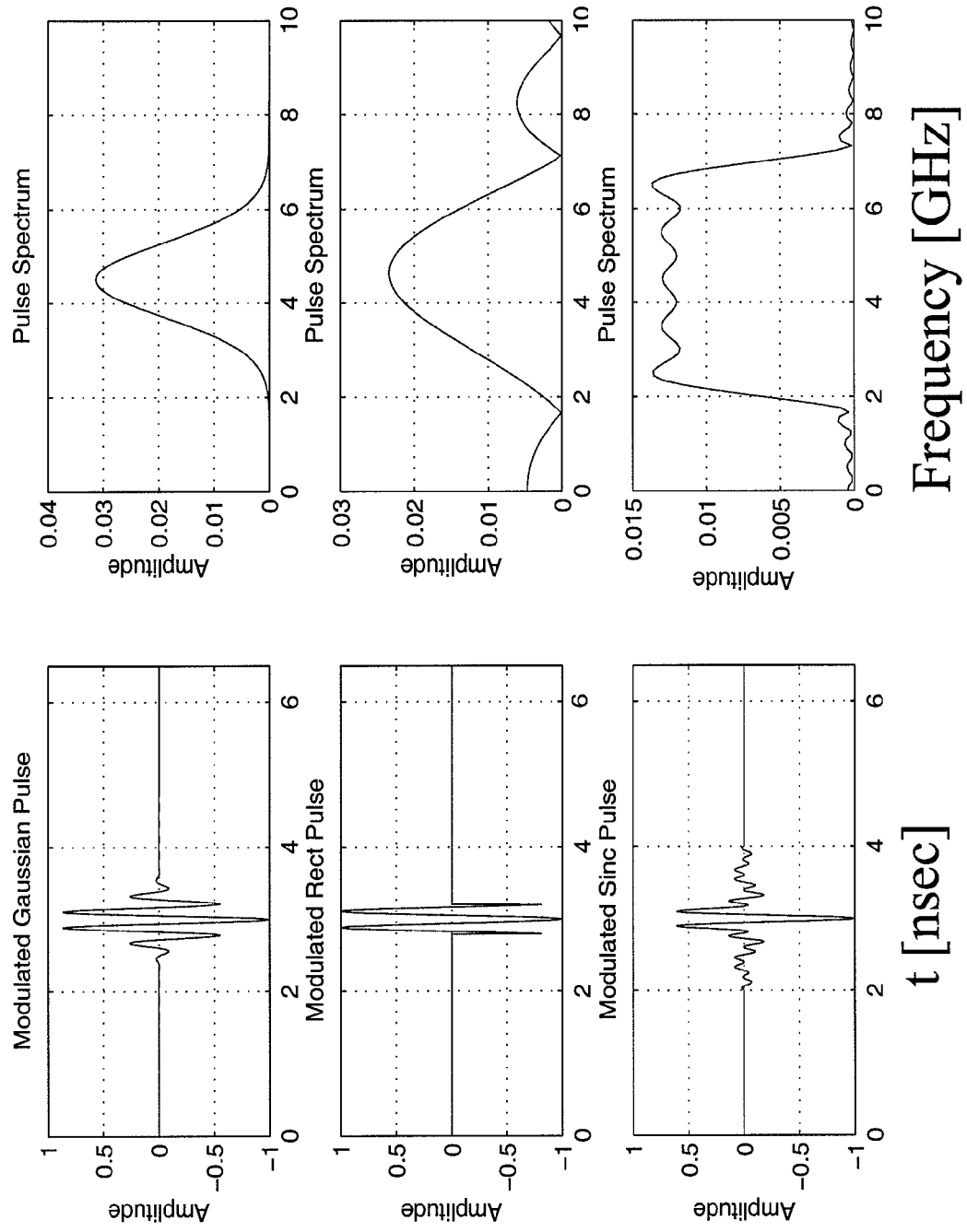
FIG. 2 shows the pulses of FIG. 1 with a center frequency of 4.5 GHz, and the resulting spectra of the up-converted pulses.

FIG. 1 shows examples of Gaussian, square wave, and sinc function pulses in the time and frequency domains. FIG. 2 shows time- and frequency-domain plots of the same three pulses modulated by a sinusoid at the center frequency of the desired transmission band (in this example, 4.5 GHz) to produce bursts. Such up-conversion allows occupation of a particular communications band (e.g. as specified by a system design, by a transmission standard, or by regulation). Application of embodiments of the invention is not limited to these three pulse shapes. Rather, embodiments of the invention may be applied to any pulse with sufficient spectral content to encompass the number of notches selected (e.g. to represent the desired multiplicity of bits).

Figure 3:
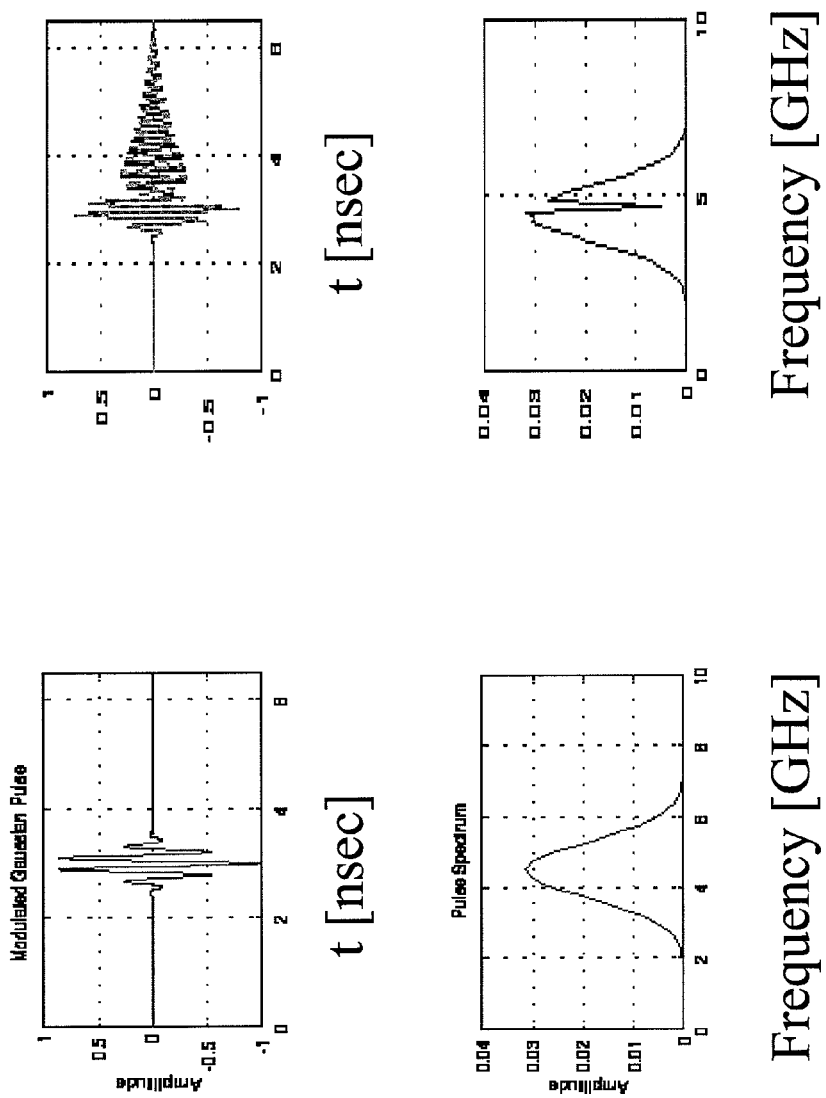
FIG. 3 shows an example of an orthogonal signaling scheme according to an embodiment of the invention.

FIG. 3 shows an example of an orthogonal signaling scheme according to an embodiment of the invention in which a different frequency band is used to encode each data value to be transferred (for simplicity, encoding of only one band is illustrated in this figure). The diagrams in the left column show an unnotched burst (e.g. indicating a '0' data value) in the time and frequency domains (top and bottom diagrams, respectively), and the diagrams in the right column show a notched burst (e.g. indicating a '1' data value) in the time and frequency domains (top and bottom diagrams, respectively).

Figure 4:
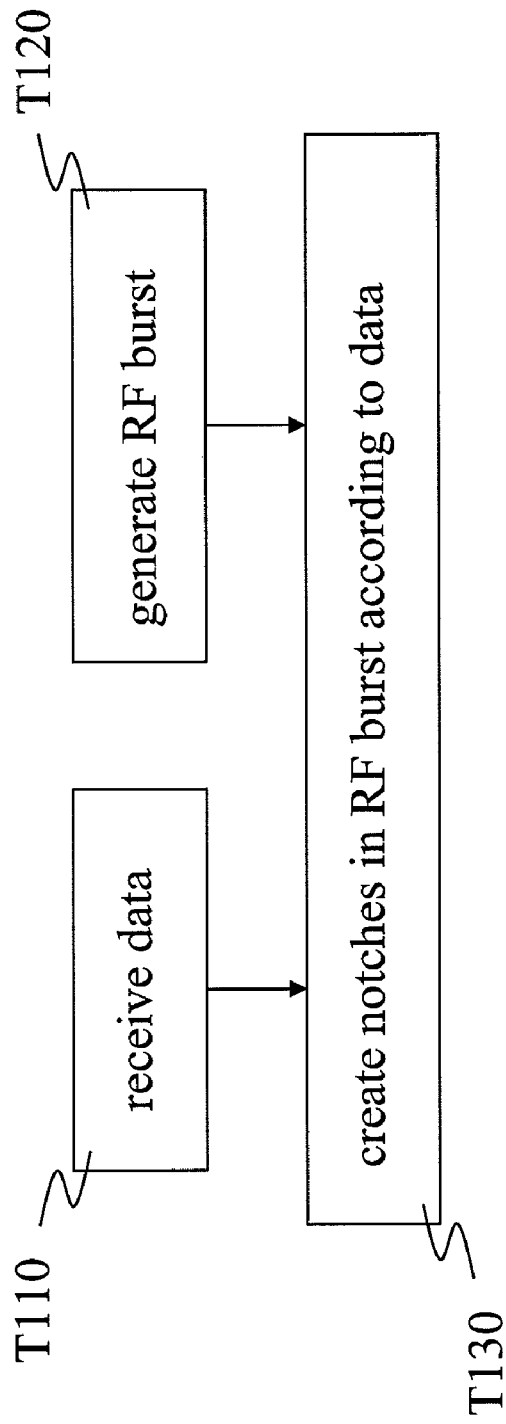
FIG. 4 shows a flowchart of a method according to an embodiment of the invention.

FIG. 4 shows a flowchart of a method according to an embodiment of the invention. Task T110 receives a set of data values for transfer. The set of data values may include a single bit, a string of bits, or one or more non-binary values. Task T120 generates a RF burst. Task T130 encodes the set of data values onto the generated burst by creating notches in the burst according to the set of data values.

Figure 5:
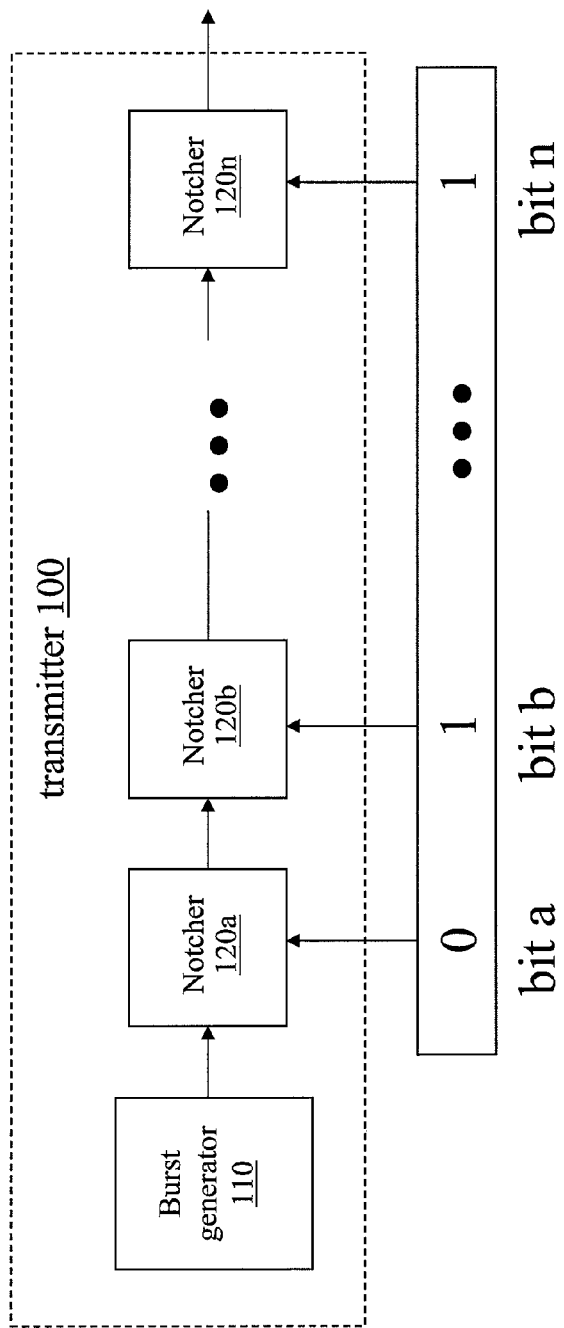
FIG. 5 shows a schematic of a transmitter 100 according to an embodiment of the invention.

FIG. 5 shows a schematic diagram of an apparatus 100 according to an embodiment of the invention. In this example, an orthogonal signaling scheme is applied in which a different frequency band is used to encode each data value to be transferred. Burst generator 110 produces a very narrow pulse (as short as several hundred picoseconds for an ultra-wideband application). The burst is notched by a bank of notchers 120 according to the data presented to them (e.g. from a register containing a binary word).

Figure 6:
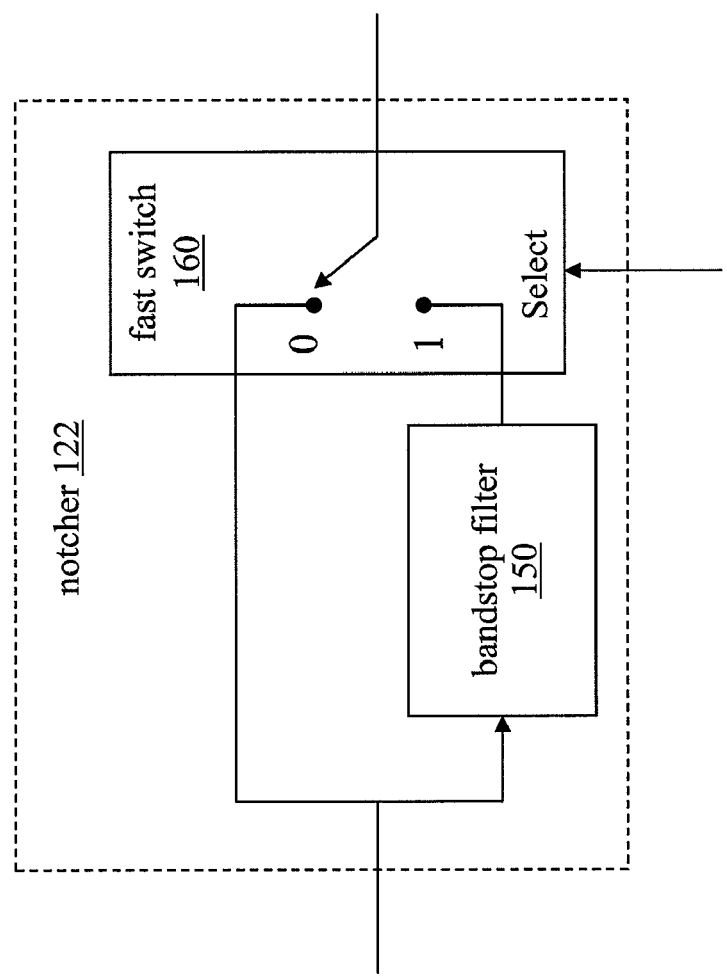
FIG. 6 shows a schematic of an implementation 122 of notcher 120.

As shown in FIG. 6, one implementation 122 of a notcher 120 includes a bandstop filter 150 for removing a selected narrowband notch that is switched into the circuit (e.g. by fast switch 160) in response to the presence of a "1" bit in the binary word. The presence of a "0" in the binary word causes filter 150 to be switched out of the circuit (i.e. passing the signal unfiltered). Each generated burst thus corresponds to and can encode a single data word by removing or retaining the selected narrowband components in the burst.

Figure 7:
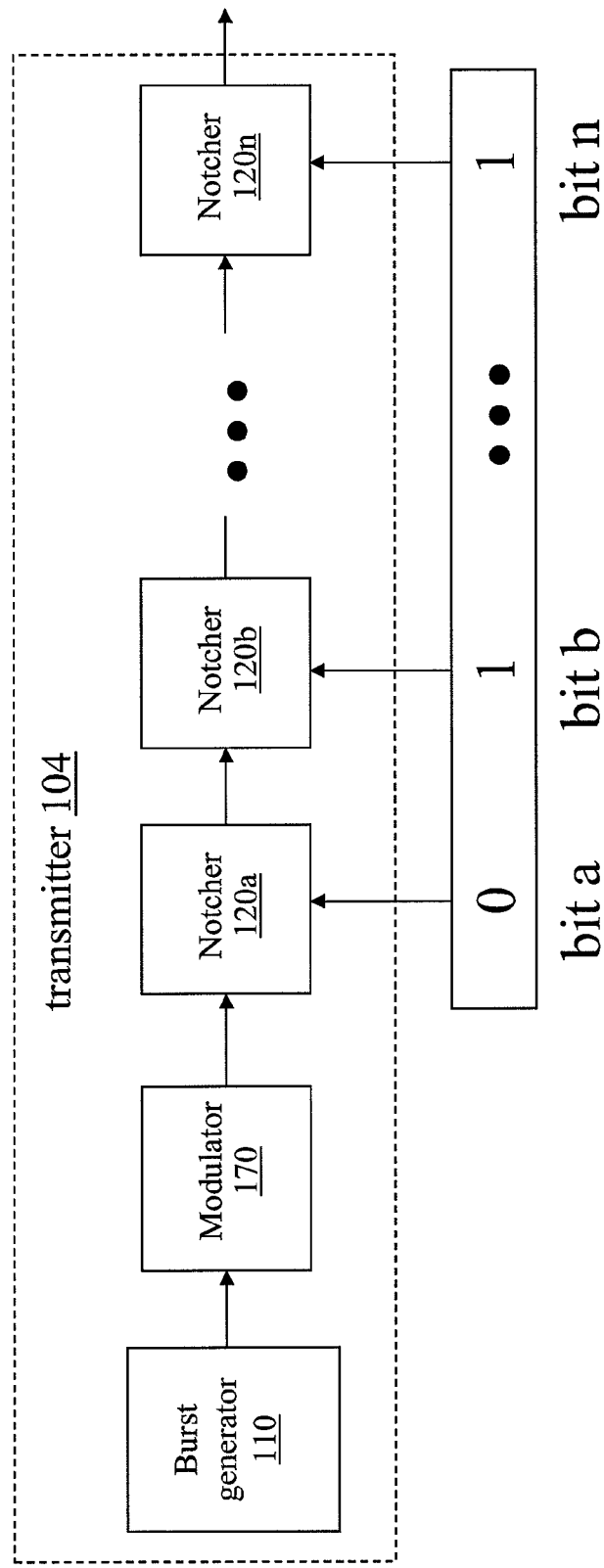
FIG. 7 shows a schematic of an implementation 104 of transmitter 100.
Figure 8:
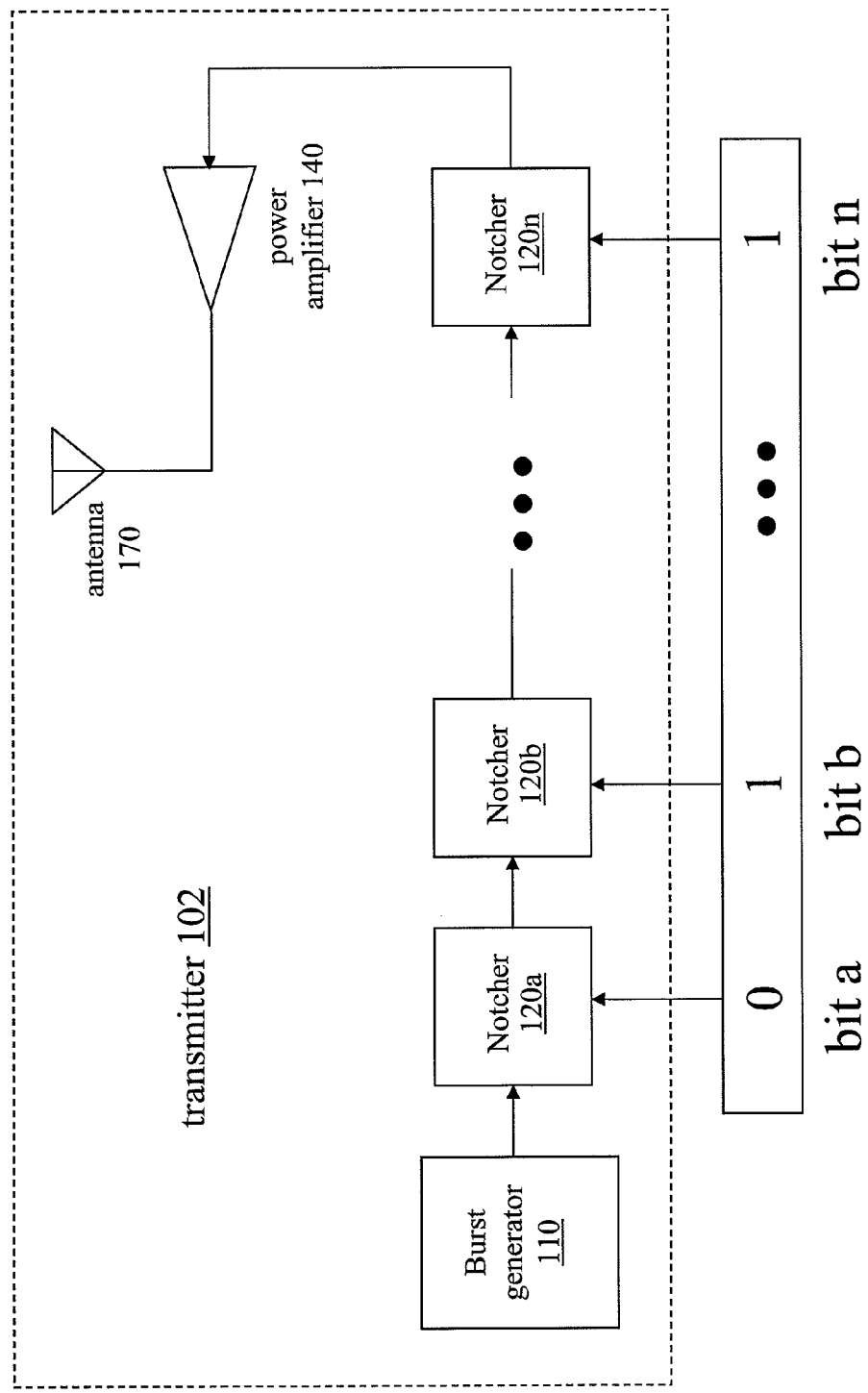
FIG. 8 shows a schematic of an implementation 102 of transmitter 100.

Burst generator 110 may generate the burst directly at the desired transmission band. Alternatively, the burst may be generated at baseband and upconverted before notching (e.g. within burst generator 110 or by modulator 170, as in implementation 104 of transmitter 100 as shown in FIG. 7). FIG. 8 shows a schematic diagram of an implementation 102 of transmitter 100 that includes a power amplifier 140 and antenna 170.

Burst generator 110 is configured to generate bursts that may vary in duration from a portion (e.g. 50% to 100%) of a cycle to several cycles. In one example, burst generator 110 generates a burst as an impulse that is filtered and/or amplified. Alternatively, a burst may be generated by gating a continuous-wave signal. For example, burst generator 110 may include a broadband oscillator with controllable bandwidth. Example configurations for burst generator 110 include the following:

1) A circuit or device that produces a fast edge or pulse that is followed by a bandpass filter. The circuit or device that produces the fast edge or pulse generates a waveform with broadband spectral content, and the filter selects the frequency band over which transmission of the burst is desired. Examples of circuits or devices that produce a fast edge or pulse include high-speed logic gates such as ECL (emitter-coupled logic) and PECL (positive ECL). Such circuits or devices may also include avalanche transistors, avalanche diodes, and/or step recovery diodes. Examples of suitable filters may include cavity filters, surface acoustic wave (SAW) filters, discrete filters, transmission line filters, and/or any other RF filter technique. In this case, the filter controls the relationship between energy and frequency within the band, and also establishes the roll-off profile of energy outside the band.

2) A tunable oscillator followed by a switching device. The tunable oscillator establishes the center frequency of the burst. The tunable oscillator can be any tunable source of continuous-wave RF energy, such as a voltage-controlled oscillator, a YIG (yttrium-indium gamet)-tuned oscillator, a dielectric resonator oscillator, a backward wave oscillator, and/or a oscillator circuit including a reflex klystron, magnetron, or Carcinotron. The switching device sets the width of the burst, which defines the bandwidth of the spectral content. Suitable switching devices may include mixers, solid-state RF switches, laser-controlled RF switches, plasma-based RF switches, and/or switches that utilize an electron beam.

3) A semiconductor solid-state oscillator that produces a frequency burst in response to a pulsed control voltage. The pulsed control voltage may be provided by any circuit or device capable of delivering a pulse with the desired burst width and amplitude. In order to provide a faster on/off transition, the control voltage may be biased with a DC level that is under the oscillation threshold, such that application of the pulse raises the voltage over the oscillation threshold and causes the device to oscillate for the duration of the applied pulse. Examples of suitable solid-state oscillators may include Gunn devices, IMPATT (impact ionization avalanche transit time) diodes, TRAPATT (trapped plasma avalanche-triggered transit) diodes, and/or BARITT (barrier injection transit-time) diodes.

4) A thermionic oscillator that produces a frequency burst in response to a pulsed control voltage. The pulsed control voltage may be provided by any circuit or device capable of delivering a pulse with the desired burst width and amplitude. Examples of control voltages include a grid voltage, a body voltage, or a reflector voltage. In order to provide a faster on/off transition, the control voltage may be biased with a DC level that is under the oscillation threshold, such that application of the pulse raises the voltage over the oscillation threshold and causes the device to oscillate for the duration of the applied pulse. Examples of suitable thermionic oscillators may include backward wave oscillators, Carcinotrons, magnetrons, and/or reflex klystrons.

Burst generator 110 may be configured to emit a burst upon receiving a trigger pulse. In other implementations, burst generator 110 may be configured to emit a burst upon receiving a rising edge or a falling edge or upon some other event (which trigger pulse, edge, or other event may be electrical and/or optical). Burst generator 110 may be configured to emit bursts of constant or varying time duration and/or frequency.

Figure 9:
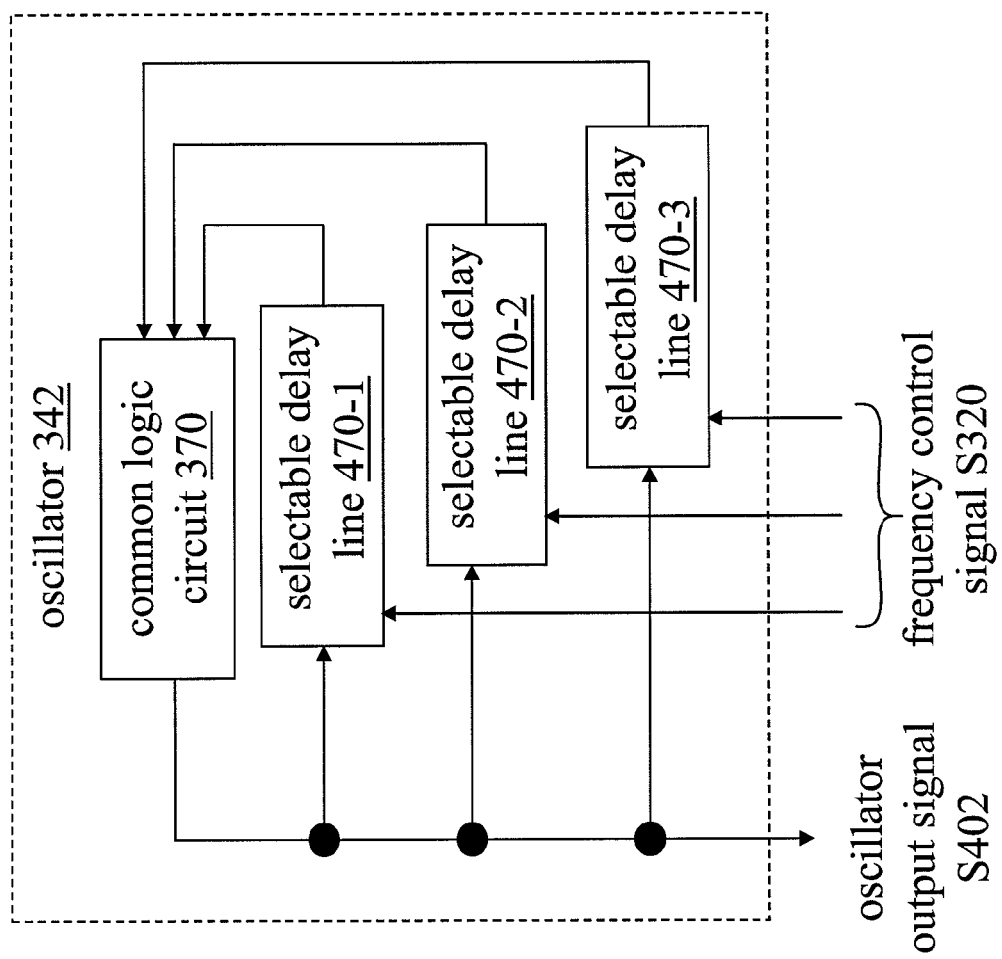
FIG. 9 shows a block diagram of an oscillator 342 according to an embodiment of the invention.

FIG. 9 shows a block diagram of a tunable oscillator 342 according to an embodiment of the invention. Oscillator 342 includes selectable delay lines 470, which introduce delays of different periods. Such delay lines may include analog delay elements (e.g. inductors, RC networks, long transmission lines) and/or digital delay elements (e.g. inverters and/or other logic elements or gates). A common logic circuit 370 is coupled to the output terminal of each selectable delay line 470. Common logic circuit 370, which includes one or more logic gates, changes the state of its output signal according to a state transition at one of its inputs and may or may not invert the received state transition depending on the particular circuit configuration. Each of selectable delay lines 470 is selectable via frequency control signal S320 such that only one receives an output signal from common logic circuit 370 during any time period. It may be desirable in some implementations to buffer the output of oscillator 342 before connection of oscillator output signal S402 to a load.

In some implementations, a selectable delay line 470 may include a portion of the path that couples the selectable delay line to common logic circuit 370, with the length and/or character of such portion being designed to introduce a desired propagation delay or other effect. In other implementations, the delay (and/or the delay difference between delay lines) introduced by such paths may be considered negligible.

An external control circuit or device provides frequency control signal S320 to control the frequency of the oscillator's output. For example, frequency control signal S320 may indicate a burst occupying a particular frequency band. For at least some implementations of oscillator 342, the frequency of oscillator output signal S402 may be changed at every cycle of the oscillation.

Figure 10:
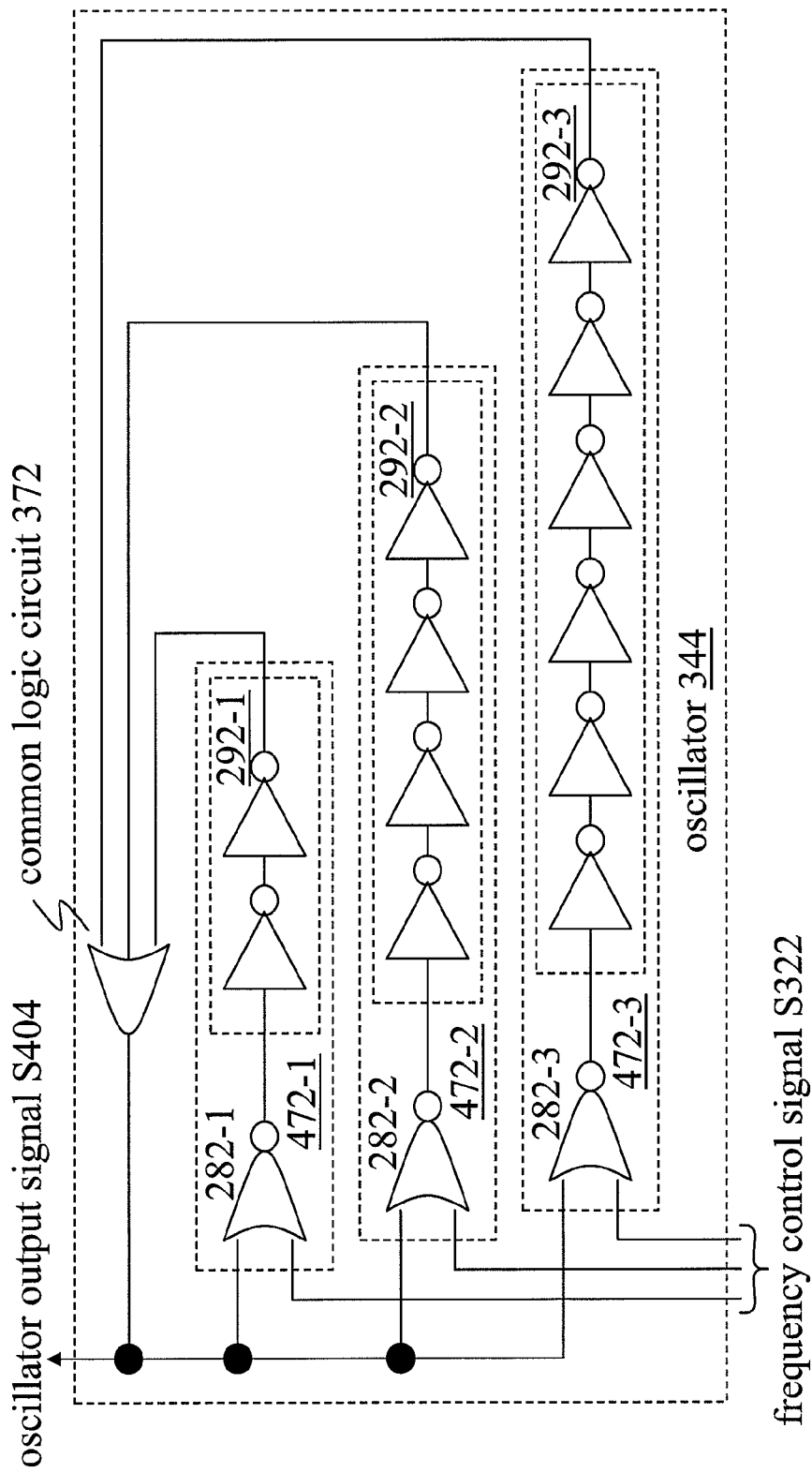
FIG. 10 shows a block diagram of an implementation 344 of oscillator 342.

FIG. 10 shows a block diagram of an implementation 344 of oscillator 342. Each selectable delay line 472 includes an inverting selector portion 282 (e.g. a NOR gate) and a delay portion 292 having an even number of inverters in series. Common logic circuit 372 is a noninverting selector (e.g. an OR gate). In this case, the lines of frequency control signal S322 are active low.

Figure 11:
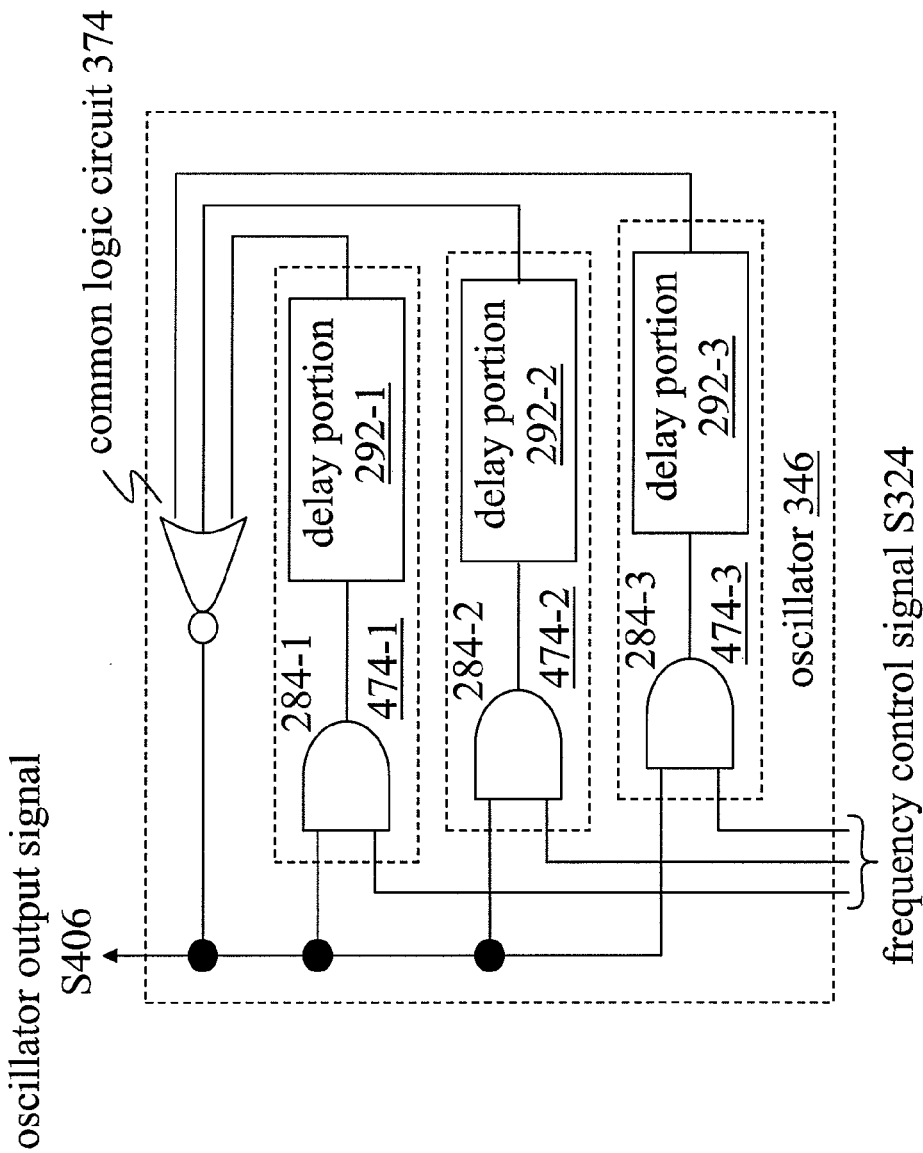
FIG. 11 shows a block diagram of an implementation 346 of oscillator 342.

FIG. 11 shows a block diagram of an implementation 346 of oscillator 342. Each selectable delay line 474 includes a noninverting selector portion 284 (e.g. an AND gate) and a delay portion 292 having an even number of inverters in series. Common logic circuit 374 is an inverting selector (e.g. a NOR gate). In this case, the lines of frequency control signal S324 are active high.

Figure 12:
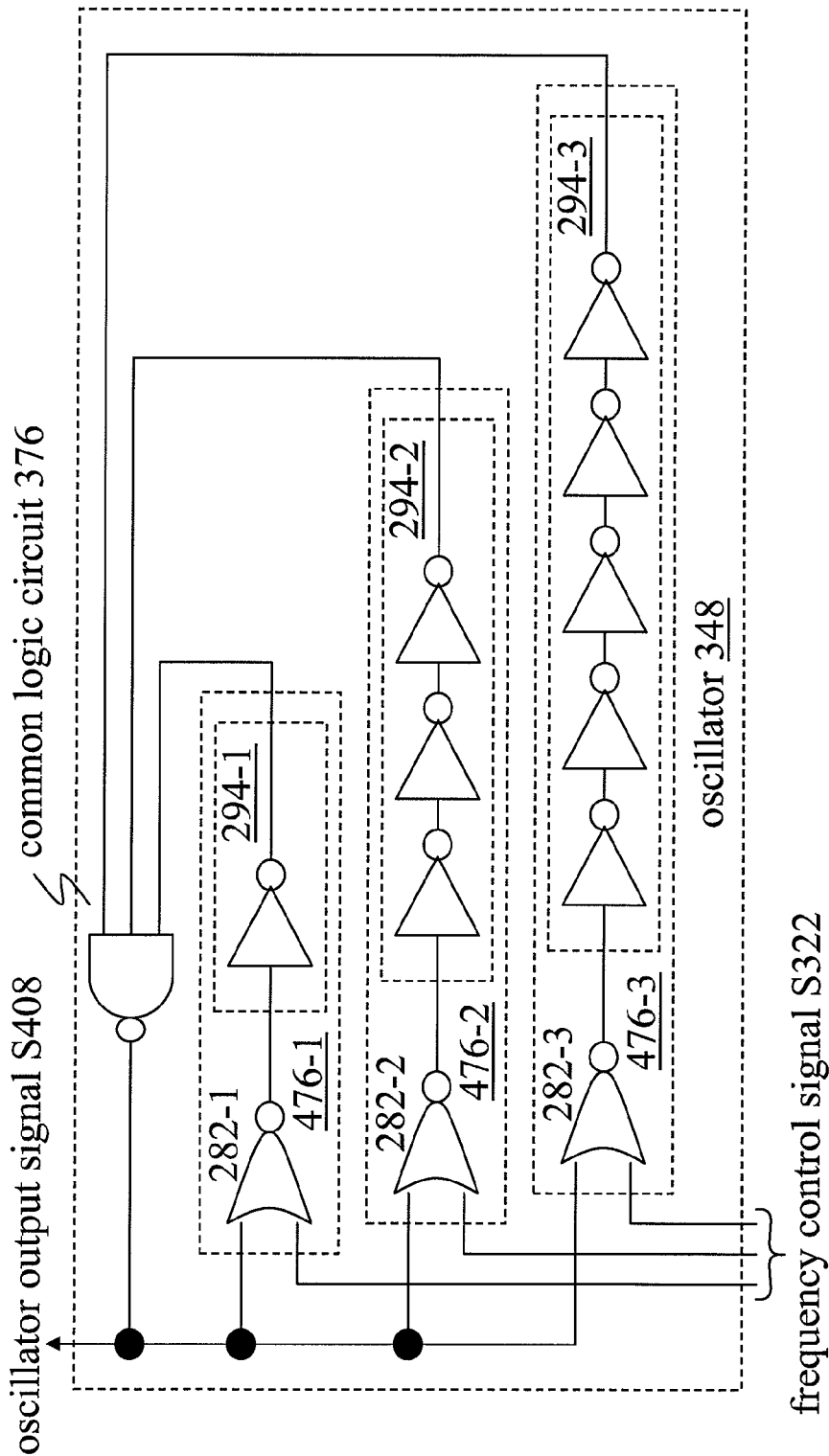
FIG. 12 shows a block diagram of an implementation 348 of oscillator 342.

Many other configurations are possible for oscillator 342, including configurations in which each selectable delay line includes a chain having an odd number of inverters in series. For example, FIG. 12 shows such a configuration 348 that includes selectable delay lines 476 having delay portions 294 (in this case, the lines of frequency control signal S322 are active low). The shortest path in an implementation of oscillator 342 may include only three inversions, while the longest path may include an arbitrarily large odd number of inversions. Additionally, the number of different selectable delays in an implementation of oscillator 342 may be arbitrarily large.

Figure 13:
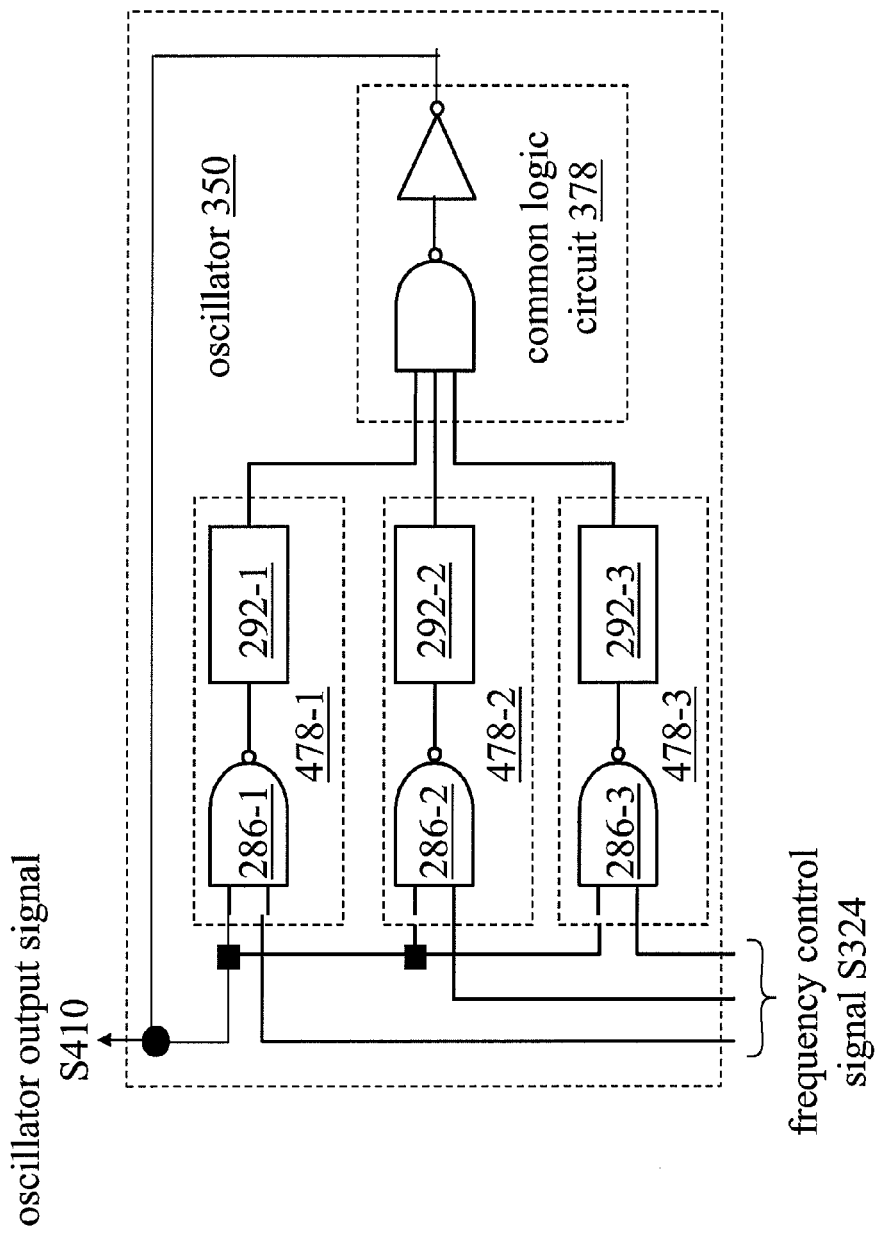
FIG. 13 shows a block diagram of an implementation 350 of oscillator 342

FIG. 13 shows a block diagram of an implementation 350 of oscillator 342 in which an implementation 378 of common logic circuit 370 includes a NAND gate and an inverter. In this example, each selectable delay line 478 includes a selector portion 286 (e.g. a NAND gate) and a delay portion 292 that includes a generic (e.g. analog and/or digital) delay line.

Figure 14:
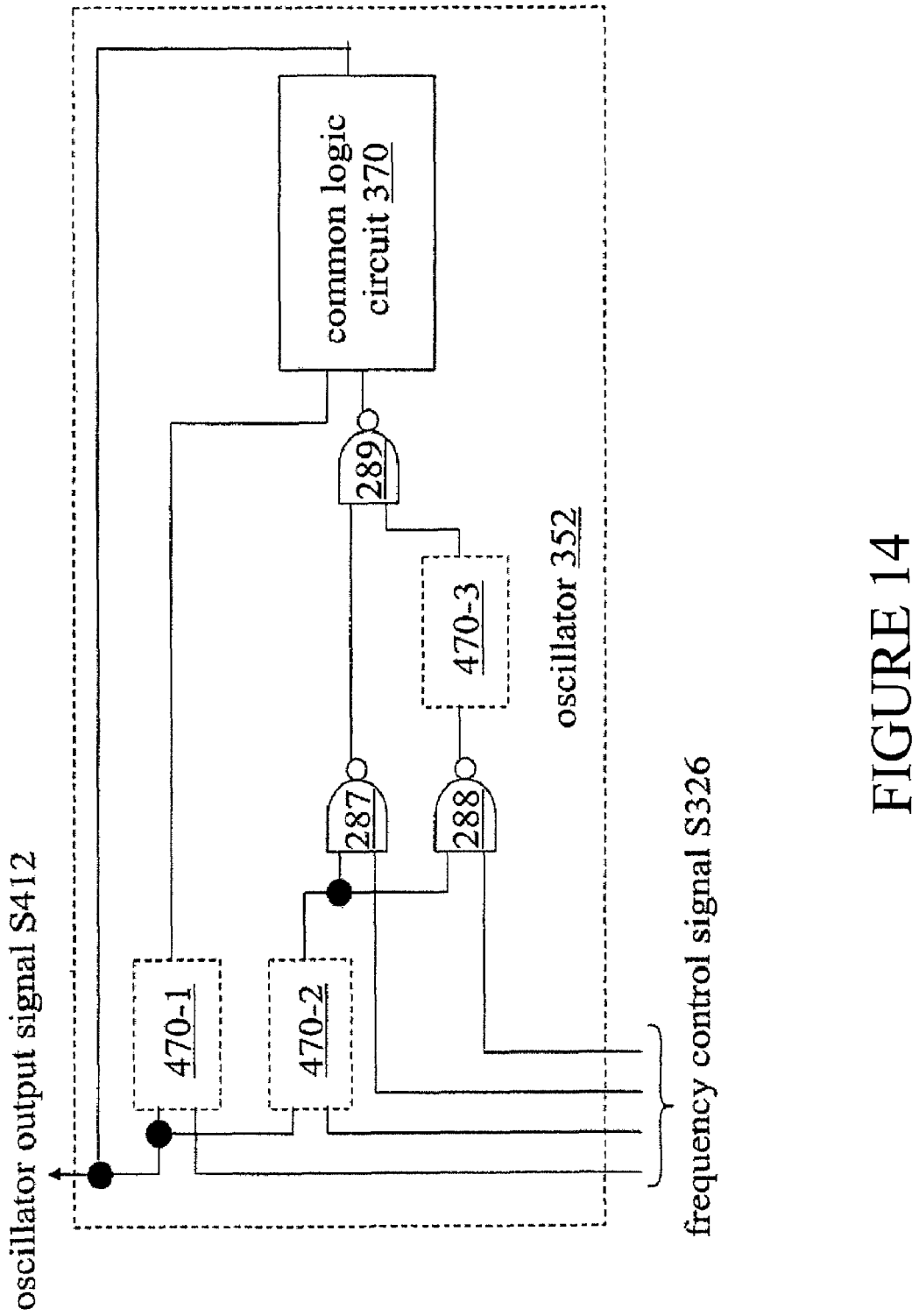
FIG. 14 shows a block diagram of an implementation 352 of oscillator 342.

In some implementations of oscillator 342, one or more delay paths may be further selectable. For example, FIG. 14 shows an implementation 352 of oscillator 342 in which one of the delay paths includes two individual selectable delay lines 470.

Oscillators based on implementations of oscillator 342 as described herein may also include oscillators that produce more than one burst simultaneously, each such burst occupying a different frequency band.

A frequency of an oscillator may change over time. For example, the delays introduced by the delay lines of oscillator 342 may change in some cases due to environmental factors, such as temperature or voltage, or to other factors such as aging or device-to-device variances. It may be desirable to compensate for these variations, e.g. in order to maintain a desired oscillation frequency.

Figure 15:
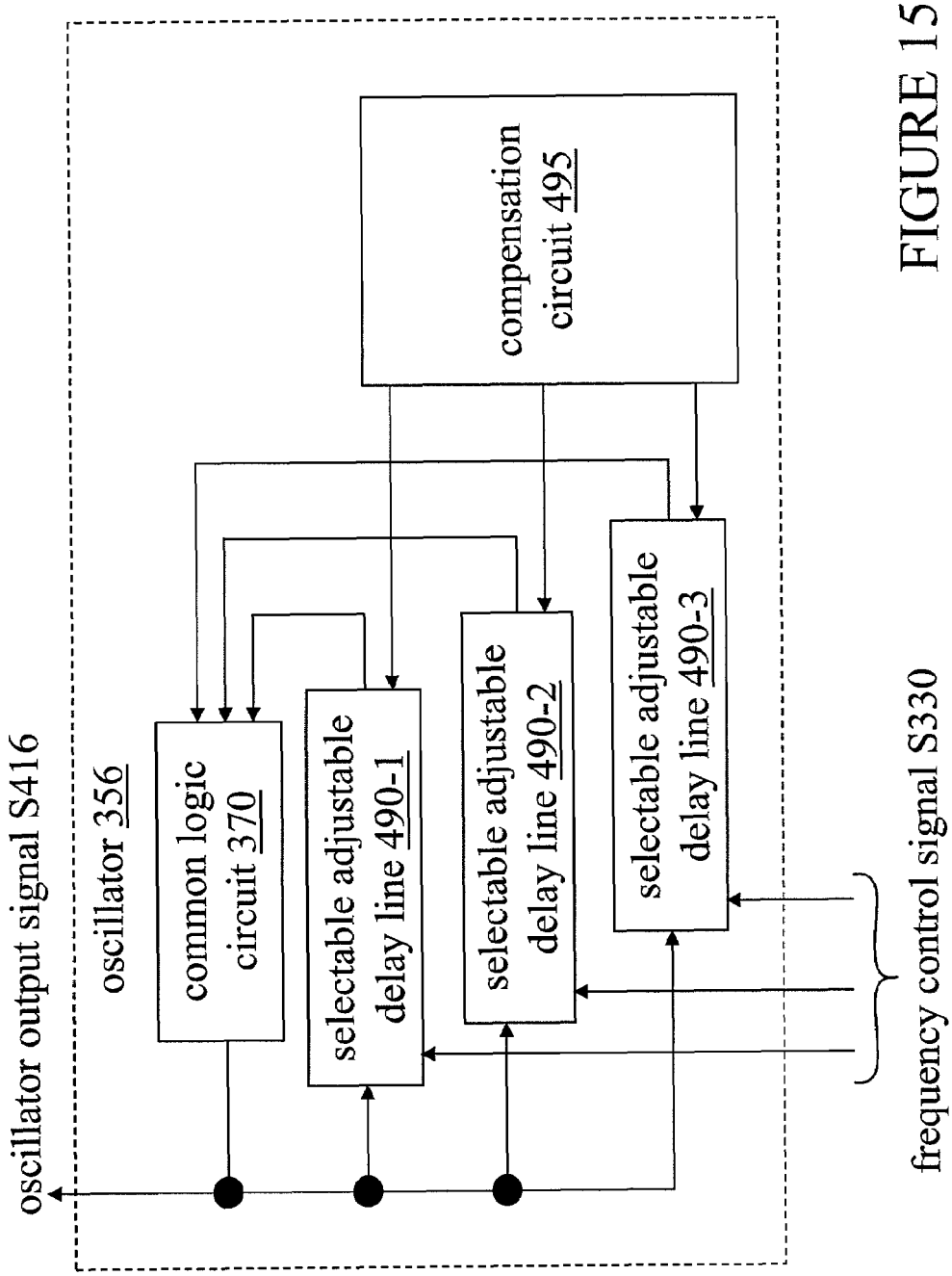
FIG. 15 shows a block diagram of an implementation 356 of oscillator 342 and a compensation mechanism 495.

FIG. 15 shows an implementation 356 of oscillator 342 that includes selectable adjustable delay lines 490. Each of selectable adjustable delay lines 490 may include a controllable delay element as described in, e.g., any one of U.S. Pat. Nos. 5,646,519; 5,731,726; or 6,054,884. Compensation circuit 495 controls a delay period of at least one of selectable adjustable delay lines 490.

Figure 16:
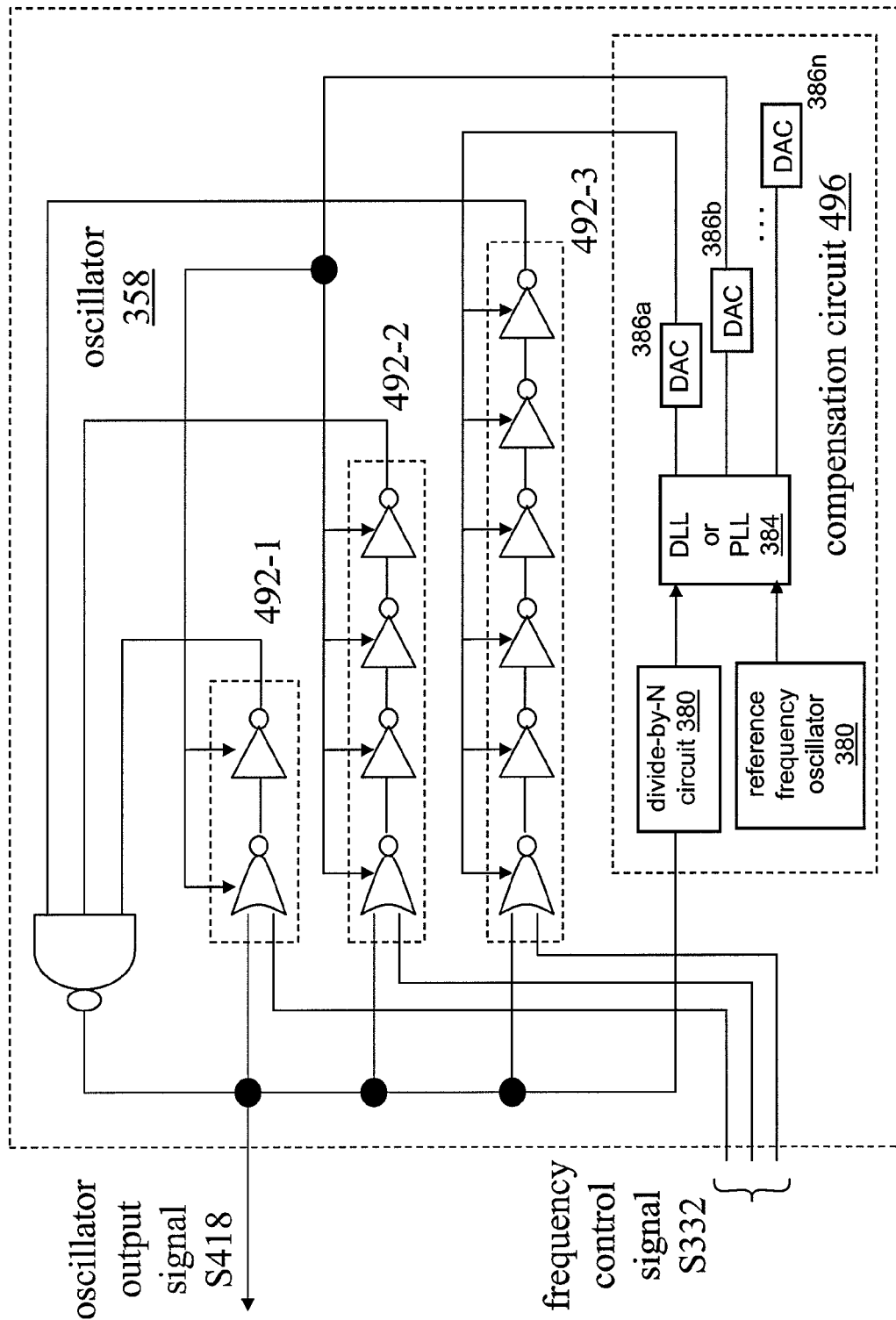
FIG. 16 shows a block diagram of an implementation 358 of oscillator 342 and an implementation 496 of compensation mechanism 495.

FIG. 16 shows a block diagram of an implementation 358 of oscillator 342 that includes an implementation 496 of compensation circuit 495. Divide-by-N circuit 380 scales the frequency of the oscillator output to match that of a reference frequency oscillator 382. A phase-locked loop (or digital locked loop) 384 compares the two frequencies and outputs a signal (e.g. a voltage) according to a difference in frequency or phase between them. One or more digital-to-analog converters (DACs) and/or controllable voltage references 386 may be included to convert a digital difference signal into an analog signal to control a characteristic of one or more of the adjustable delay lines 492. A DAC or controllable reference may be dedicated to one delay line or may control more than one delay line. The DACs or controllable references may also serve to sample and hold the difference signal until a subsequent compensation operation. In another implementation, one or more of the adjustable delay lines are controlled digitally.

Figure 17:
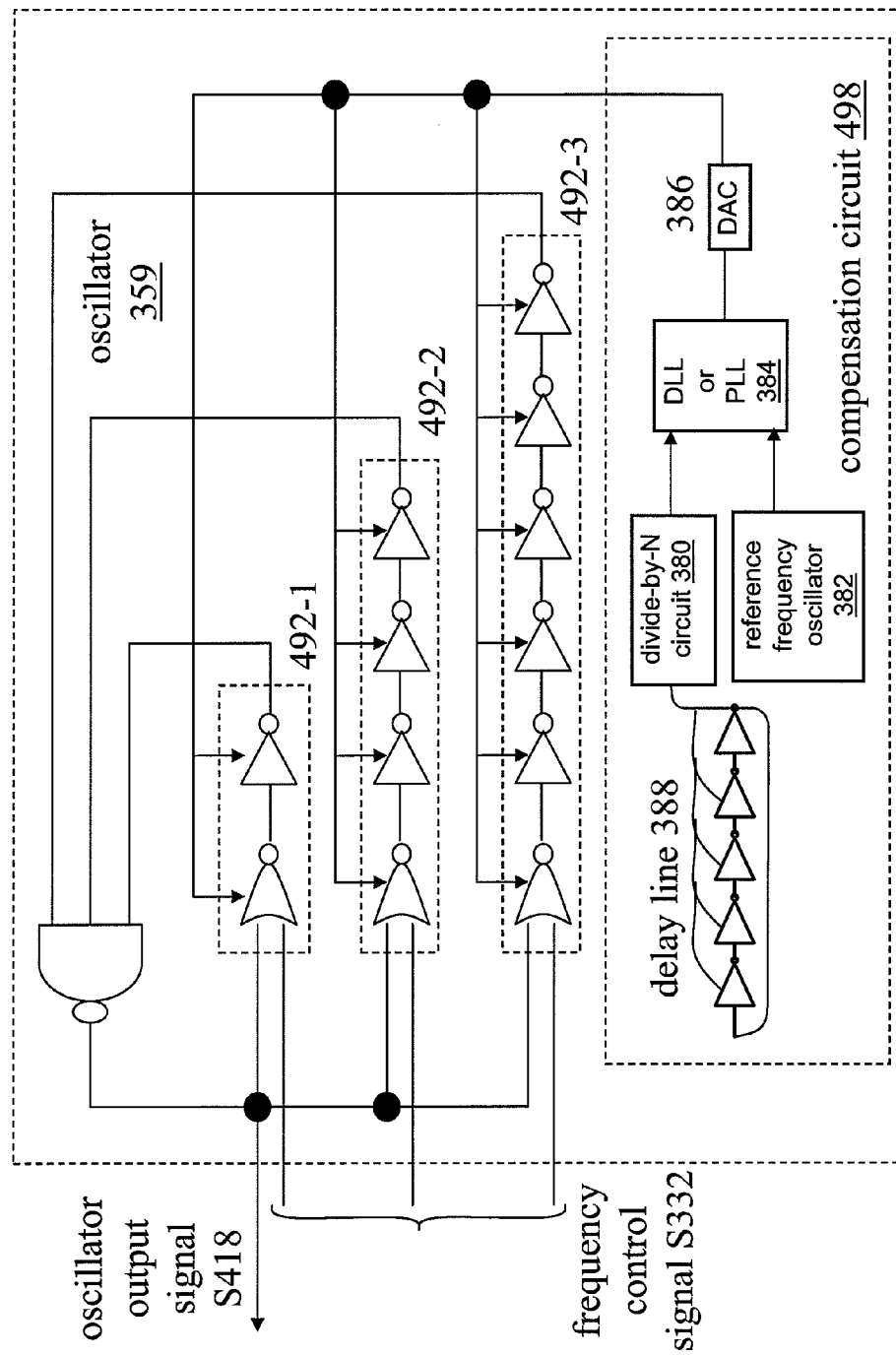
FIG. 17 shows a block diagram of an implementation 359 of oscillator 342 and an implementation 498 of compensation mechanism 495.

FIG. 17 shows a block diagram of an implementation 359 of oscillator 342 that includes an alternate implementation 498 of compensation circuit 495. This circuit includes an additional delay line 388 that is fabricated to react to environmental changes in the same way as the adjustable delay lines 492. The adjustable delay lines are then controlled according to a frequency or phase error in the additional delay line 388.

Figure 18:
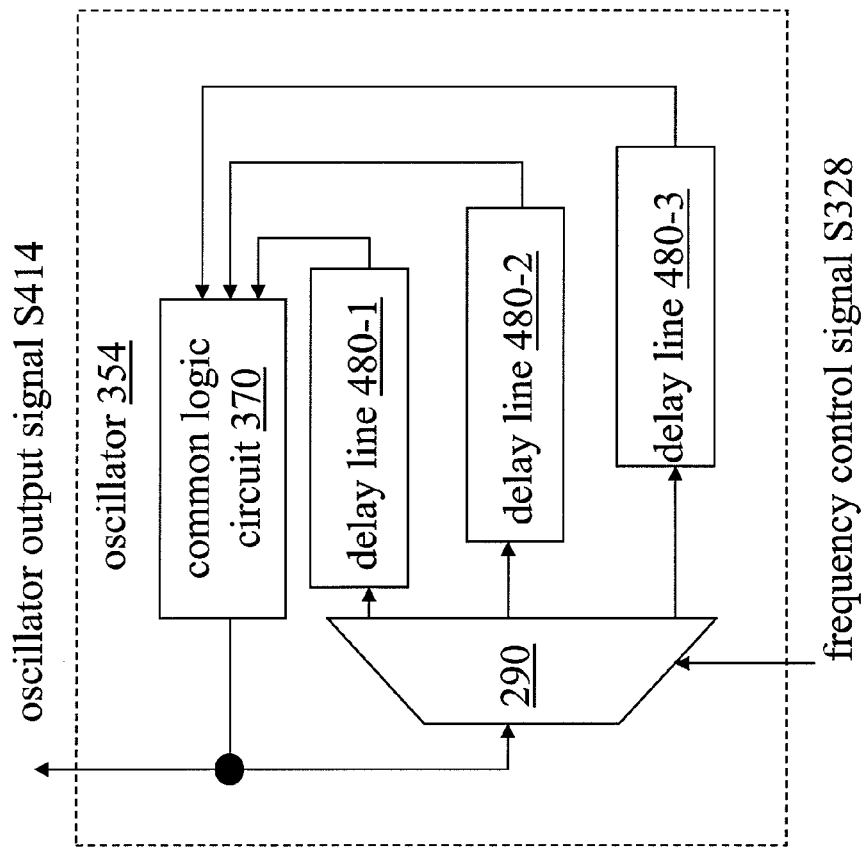
FIG. 18 shows a block diagram of an implementation 354 of oscillator 342.

FIG. 18 shows a block diagram of an implementation 354 of oscillator 340 that may be used in place of oscillator 342, e.g. in many of the applications described herein. In this implementation, multiplexer 290 applied an implementation S328 of frequency control signal S320 to provide selection between the various delay lines 480, which may be adjustable (e.g. by a compensation circuit as described herein) but need not include selector portions.

In some applications, it may be acceptable to run oscillator 340 continuously. In other applications, it may be desirable to reduce power consumption by, e.g., turning on oscillator 340

(or a portion thereof, such as a compensation circuit) only a short period before transmitting.

In some implementations of oscillator 342, an oscillator output signal may be tapped off for signal launch at more than one location. For example, tap off can occur at a junction where all signals are combined, or could occur outside of junctions for each signal in which the signals may or may not be later combined.

Figure 19:
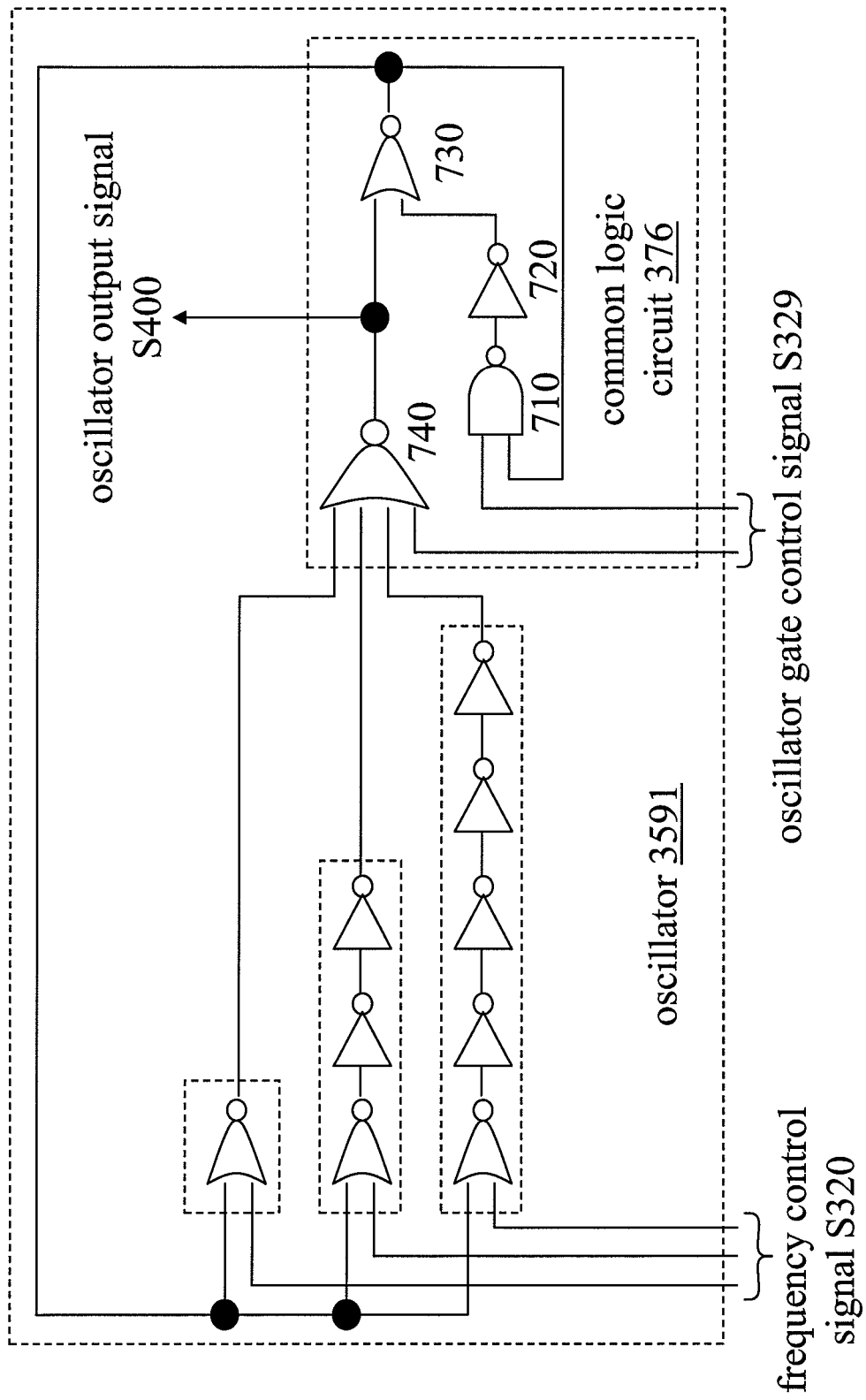
FIG. 19 shows a block diagram of an implementation 3591 of oscillator 342 according to an embodiment of the invention.

FIG. 19 shows a block diagram of an implementation 3591 of oscillator 342. When all of the delay lines are disabled (in this example, by holding all lines of frequency control signal S320 high), the oscillator section (here, gates 710, 720, and 730) within common logic circuit 376 may be set to run freely (in this example, with both lines of oscillator gate control signal S329 being high). When a signal launch is desired, frequency control signal S320 selects the desired delay line and both lines of oscillator gate control signal S329 are set low, forming a circuit including the selected delay line and output gate 740 to oscillate at the desired frequency. The lines of oscillator gate control signal S329 may be individually timed, or one line may be used. Similarly, the line or lines of oscillator gate control signal S329 may be linked to (e.g. may provide timing for or may be derived from) frequency control signal S320 or may be individually timed (e.g. depending upon factors such as gate setup and hold times and concerns such as avoiding spurious outputs). A configuration as in oscillator 3591 may reduce transients due to oscillator startup time by separating a free-running oscillator section from the output (e.g. from the signal launcher), so that this oscillator section may be continuously running between bursts or may be started-up at some time prior to the signal being launched.

In some applications, it may be desirable to filter the output of oscillator 360 (e.g. to remove unwanted harmonics). Examples of suitable filters may include cavity filters, surface acoustic wave (SAW) filters, discrete filters, transmission line filters, and/or any other RF filter technique.

Implementations of oscillator 360 as described above may be fabricated (e.g. in whole or in part) in application-specific integrated circuits (ASICs) using one or more known techniques such as ECL, PECL, CMOS, or BiCMOS and materials such as SiGe, GaAs, SiC, GaN, 'strained silicon', etc. An oscillator or burst generator as described herein may also be used to generate narrowband frequency components for use in a notched burst synthesis method as described herein.

Figure 20:
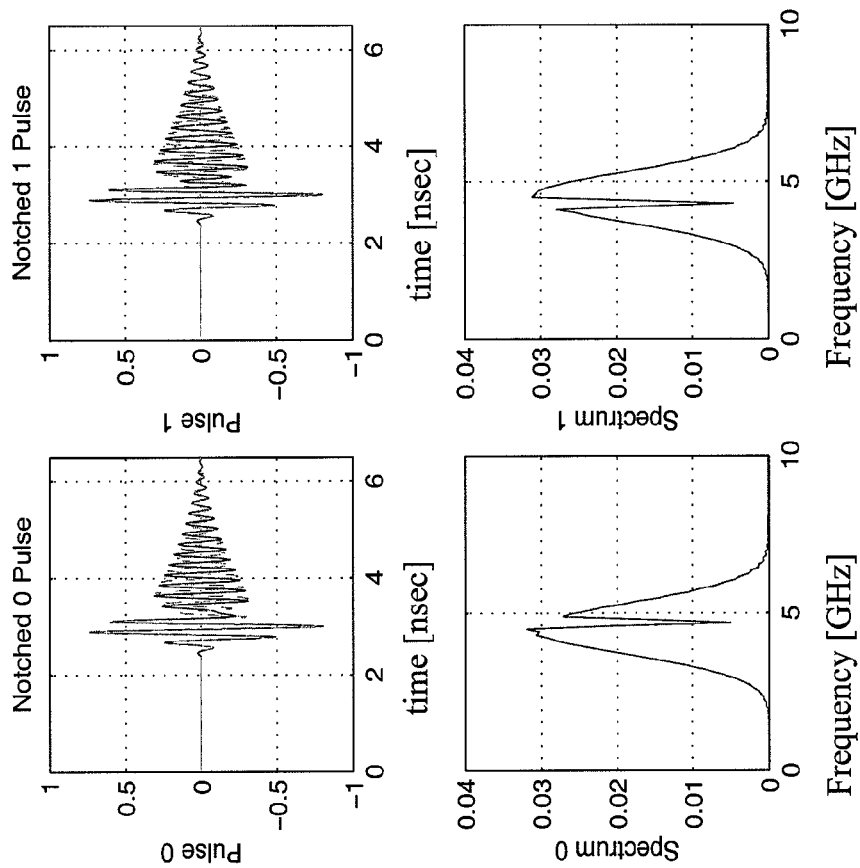
FIG. 20 shows a Gaussian pulse notched by a Butterworth band-stop filter in one of two frequency bands to illustrate one method of encoding a single bit according to an embodiment of the invention.

In addition to the orthogonal signaling scheme described above, other correspondences between data values for transmission and notch bands may be applied. For example, if the amplitude of the spectrum in each frequency band of a given pair in a burst is denoted A.sub. 1 and A.sub.2, respectively, the difference (A.sub.1–A.sub.2) provides an antipodal representation of a 0 bit and 1 bit, according to which of the pair of frequency bands is notched out and which is left present in the burst. FIG. 20 shows an example of an antipodal encoding scheme in which a pulse (in this example, a Gaussian pulse) is modulated and the resulting burst is notch-filtered to carry a single bit. In this antipodal scheme, notching of exactly one of a pair of frequency bands is used to encode data values at a density of one value per pair of notch bands. In other antipodal schemes, notching of exactly half of a number of frequency bands is used to encode data values.

In the example of FIG. 20, the center frequency of the burst is 4.5 GHz, and frequency bands at 4.3 and 4.7 GHz are used for encoding. A bit of value '0' or 'low' is represented by notching the band at 4.7 GHz and leaving the band at 4.3 GHz unaffected, and a bit of value '1' or 'high' is represented by notching the band at 4.3 GHz and leaving the band at 4.7 GHz unaffected. At the receiver, subtraction of the amplitude of the 4.7-GHz band of the received burst from the amplitude of the 4.3-GHz band of the received burst yields a positive signal for a '1' bit and a negative signal for a '0' bit in this scheme.

Figure 21:
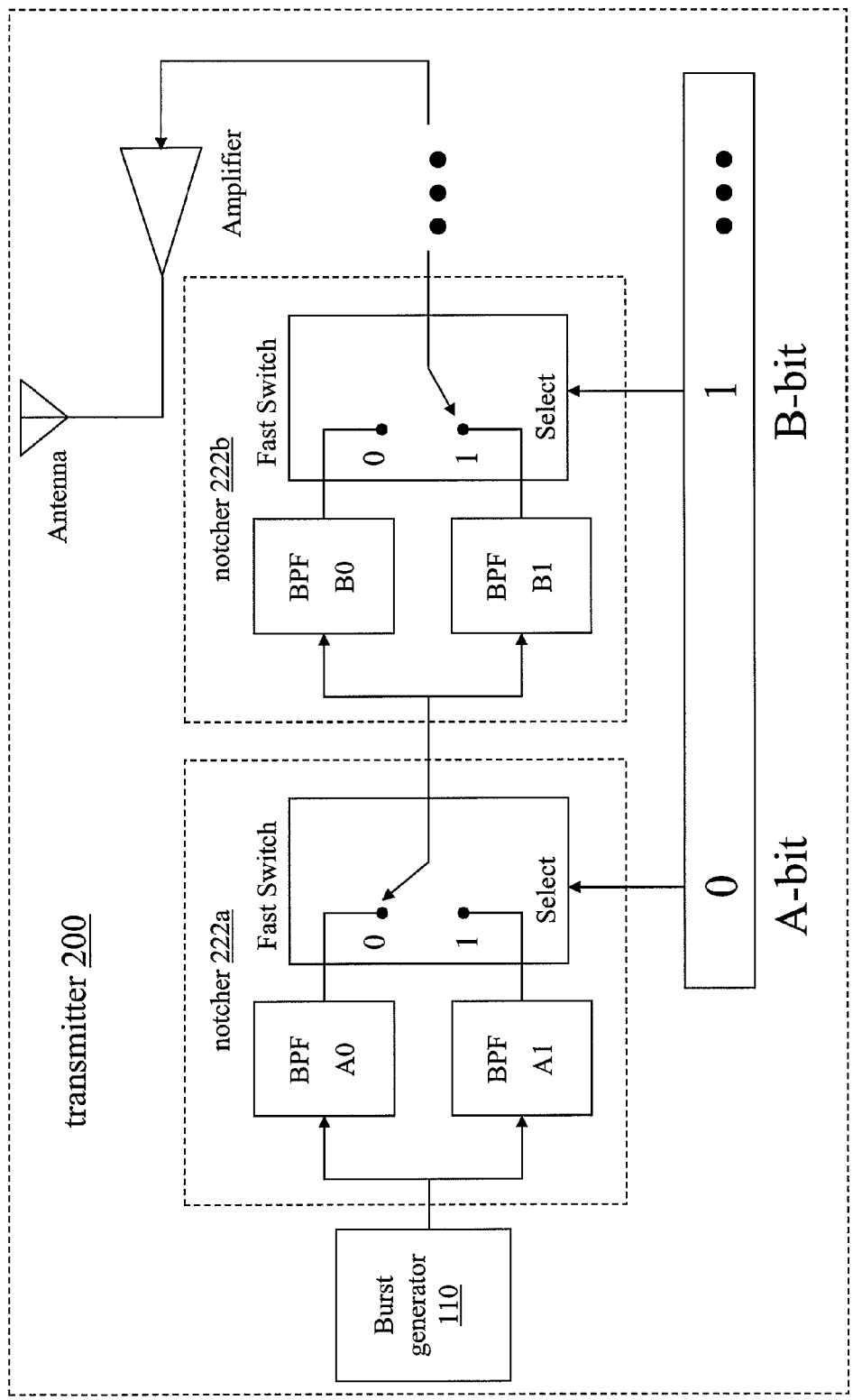
FIG. 21 shows a schematic of a transmitter 200 according to an embodiment of the invention.

As in an orthogonal signaling scheme, more than one bit may be encoded into a burst in an antipodal scheme (e.g. by adding pairs of notch bands). The band-stop filters applied in the particular example of FIG. 20 are second-order Butterworth filters with a stop band width of 100 MHz and a maximum attenuation of −60 dB attenuation and maximum phase shift of −180 degrees at the stop frequencies. FIG. 21 shows a schematic diagram for a transmitter 200 that applies an antipodal signaling scheme according to an embodiment of the invention.

An antipodal scheme may be expected to provide better robustness in the presence of noise than an orthogonal signaling scheme, at the expense of data density. Other embodiments may use more than two frequency bands per bit to provide redundancy and reduced probability of error at the expense of reduced signaling entropy (information density per burst).

Figure 22:
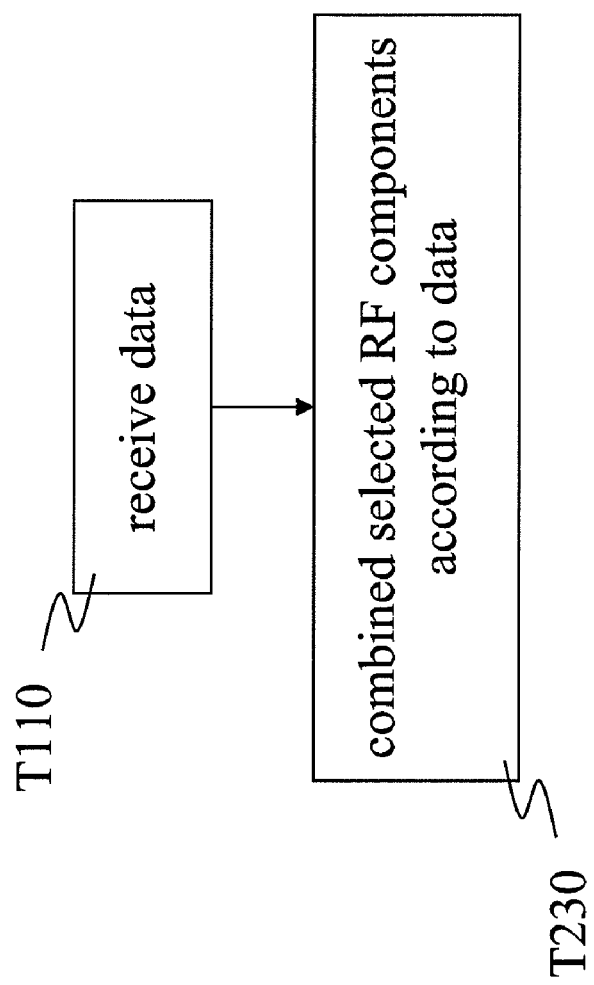
FIG. 22 shows a flowchart of a method according to an embodiment of the invention.

Information may also be encoded into a burst by combining (e.g. using a summer) selected narrowband components to construct an approximately time-limited burst (e.g. by superposition). FIG. 22 shows a flowchart of a method according to another embodiment of the invention. Task T230 encodes the set of data values onto a burst by combining selected RF components according to the set of data values. The particular sets of frequency components that are included and excluded serves to encode data in each burst. For example, such a method may synthesize the notched burst from a discrete set of sinusoids (e.g. according to a Fourier series), some components of which can be omitted or included over the duration of a single burst in order to encode the desired data. In one implementation, free-running sinusoids (with amplitudes notched only during a pulse interval) are used to produce a repetitive pulse train which may be easier to detect for both intended and unintended listeners.

In the examples described above, information is encoded by the presence or absence of notches. In other implementations of such methods and apparatus, information may be encoded within the amplitudes of the notch bands. In one example, information is represented by the amplitude of a notch. In another example, information is represented by the relative amplitudes of notch bands as compared to each other and/or to other portions of the burst spectrum.

In other embodiments, information is encoded into the phase of the burst at a selected frequency band or set of bands. In one such embodiment, each relevant band is notched out of the burst (e.g. using a band-pass filter), phase-shifted, and added back into the burst. One example of a suitable phase-shifter is a filter having a pole at the relevant-band.

Figure 23:
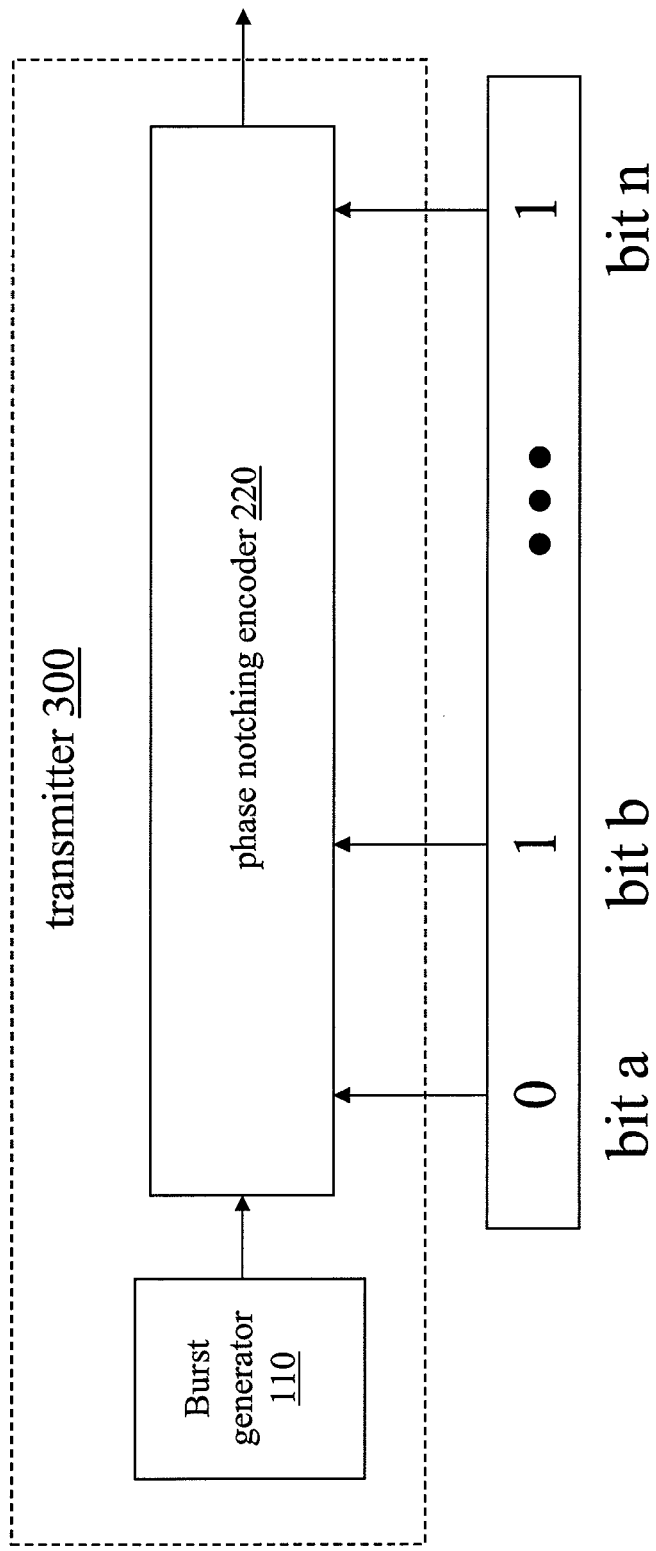
FIG. 23 shows a schematic diagram of a transmitter 300 according to an embodiment of the invention.
Figure 24:
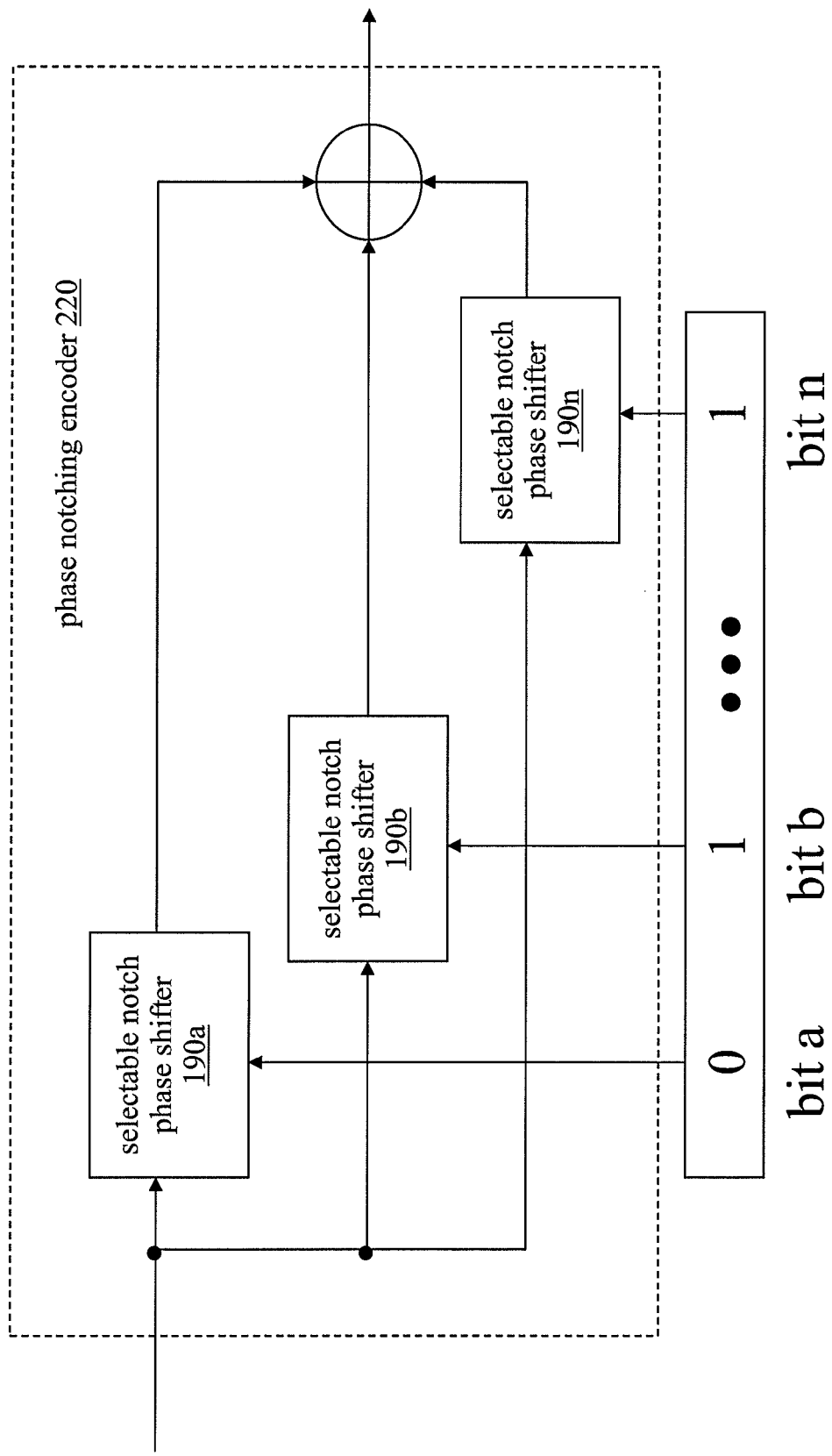
FIG. 24 shows a schematic diagram of phase notching encoder 220.
Figure 25:
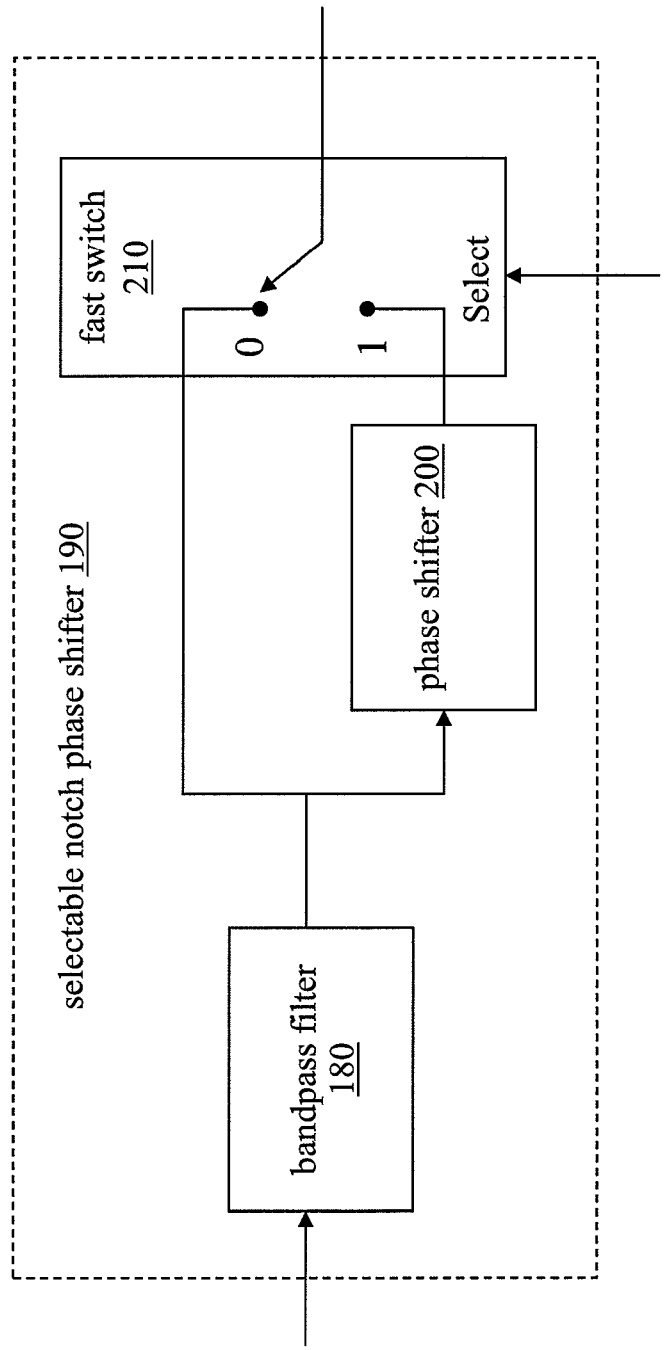
FIG. 25 shows a schematic diagram of selectable notch phase shifter 190.

FIG. 23 shows a schematic diagram of a transmitter 300 according to a further embodiment of the invention. In this arrangement, the set of data values is encoded into phase information of the notch bands. FIG. 24 shows a schematic diagram for an implementation of phase notching encoder 220, and FIG. 25 shows a schematic diagram for an implementation of selectable notch phase shifter 190.

The information encoded into the burst may be detected at the receiver by using real-time Fourier transform methods to explicitly determine the spectral content of the received burst. However, effective implementation of such an approach may require real-time digital signal processing hardware. Detection may also be accomplished via either asynchronous and synchronous demodulation or correlation processes. While some implementations of these approaches may not provide as low a probability of error as explicit real-time Fourier transform analysis, they may be more desirable in terms of ease and cost of implementation.

A method of incoherent detection according to one embodiment of the invention includes correlation with quadrature-phased sinusoids at the frequency of each notch band. The results of the correlation for each sinusoid are squared, and the pair of squares for each notch band is summed to provide a measure of the amplitude of the spectrum in the band. For an antipodal scheme, subtraction of the resulting amplitudes for a corresponding pair of bands provides a positive signal for a binary "1" and a negative signal for a binary "0" (or vice versa).

Figure 26:
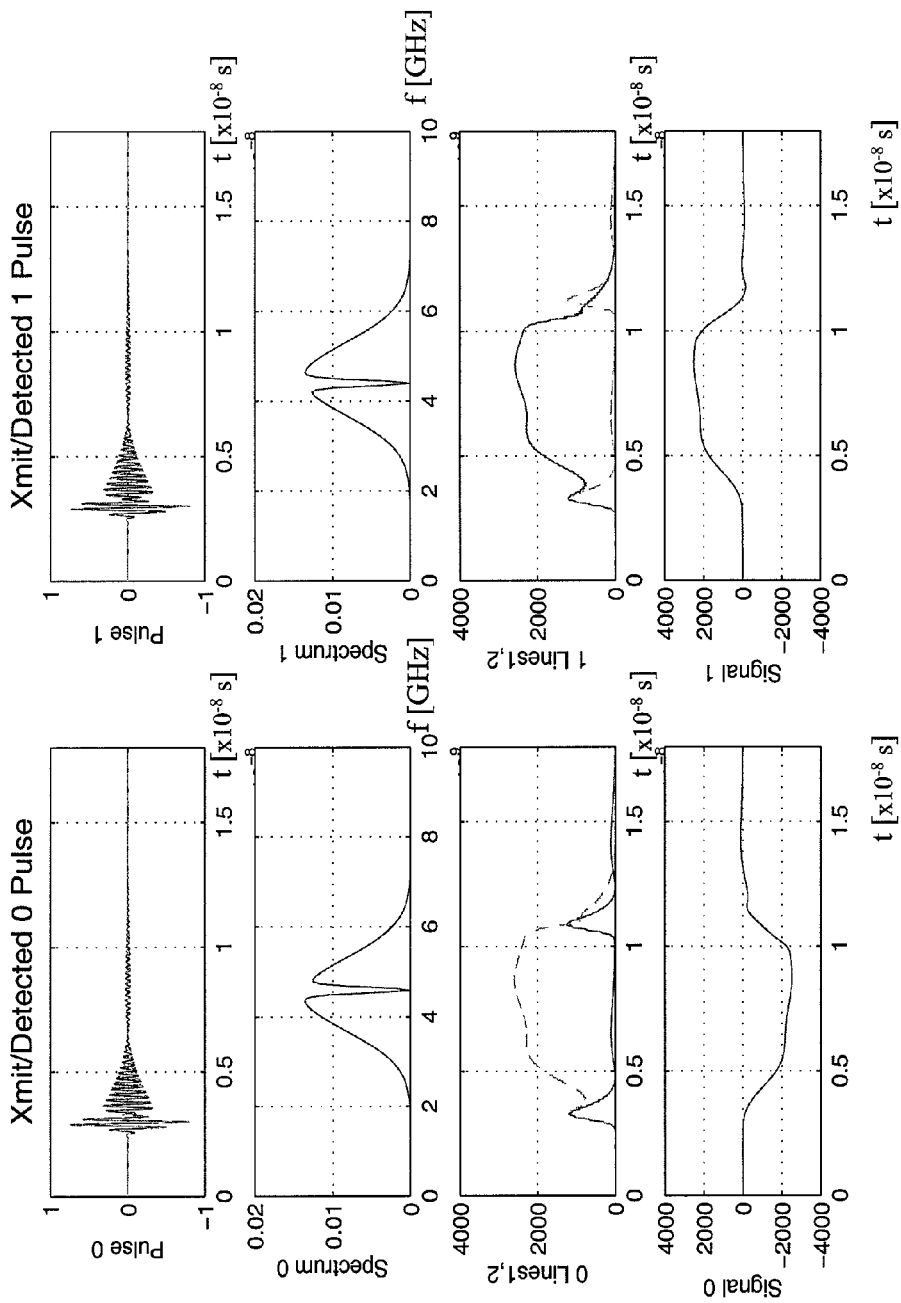
FIG. 26 illustrates a method of detecting data values encoded by antipodal notched pairs of frequency bands by asynchronous sinusoidal correlation and filtering.

FIG. 26 shows an example of this method of detection as applied to the antipodal scheme shown in FIG. 20. The bottom frames in FIG. 26 show the antipodal waveforms resulting from the detection calculation corresponding to a binary 0 (left diagram) and a binary 1 (right diagram). In quadrature-phase sinusoidal correlation, time-limited sine and cosine signals (windowed over 7 ns in this example) at a given notch frequency are correlated individually with the received signal, each result being multiplied with itself, and the two squared correlations being summed together. The result, which is an approximation to the Fourier transform of the received signal, indicates the presence or absence of a frequency band (e.g. as used to encode the data). Differencing two such calculations corresponding to one pair of frequency bands that encode a single bit provides detection in an antipodal embodiment of the scheme. Sampling at the pulse repetition frequency, and discriminating the signals according to whether the difference between the two lines is positive or negative (or, alternatively, applying a more stringent threshold criterion) allows detection. A low-pass filter can be applied to reduce the effect of high frequency noise.

Figure 27:
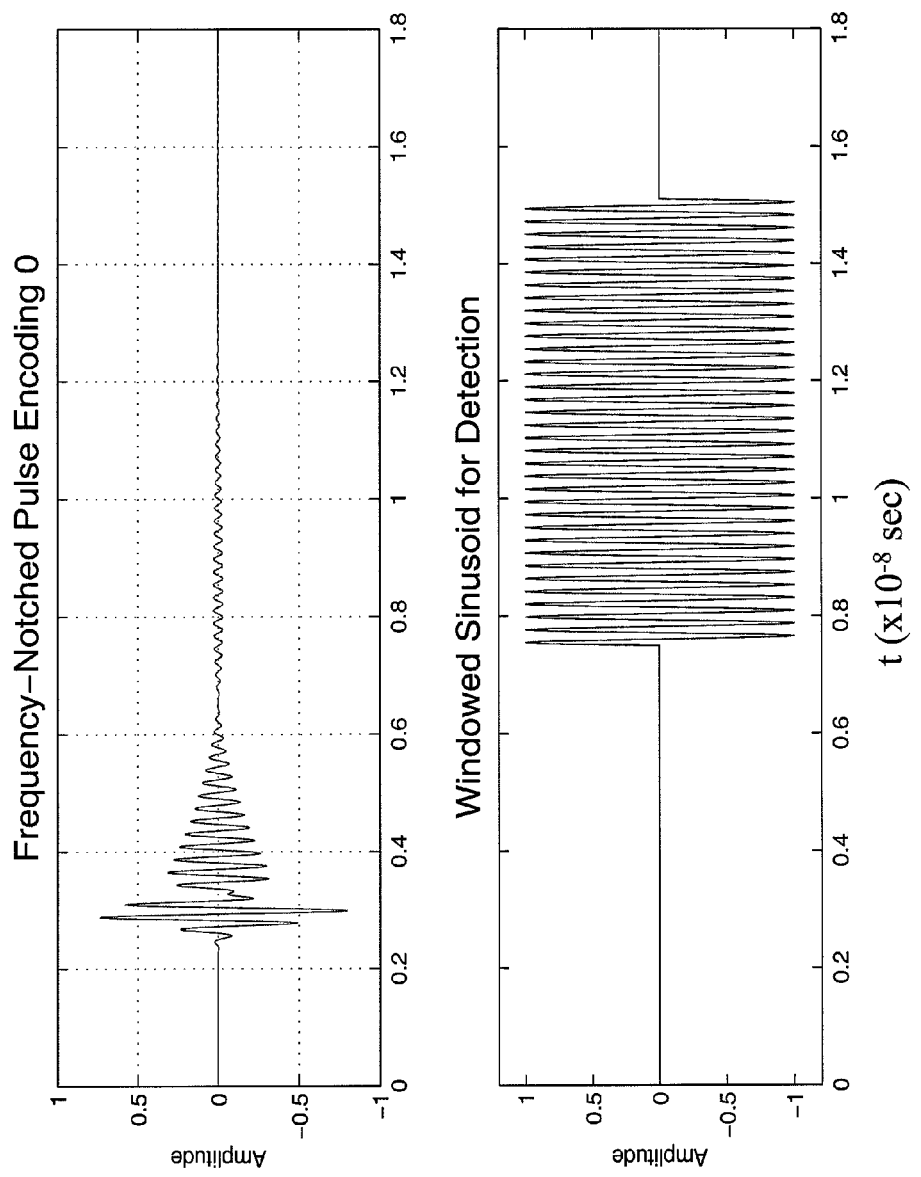
FIG. 27 shows windowed sinusoids used for detection in a method as illustrated in FIG. 26.

FIG. 27 shows the time-limited sinusoids used for detection in the example of FIG. 26. In practice, free-running sinusoids may be used, with windowing effectively being performed during an integration operation.

Figure 28:
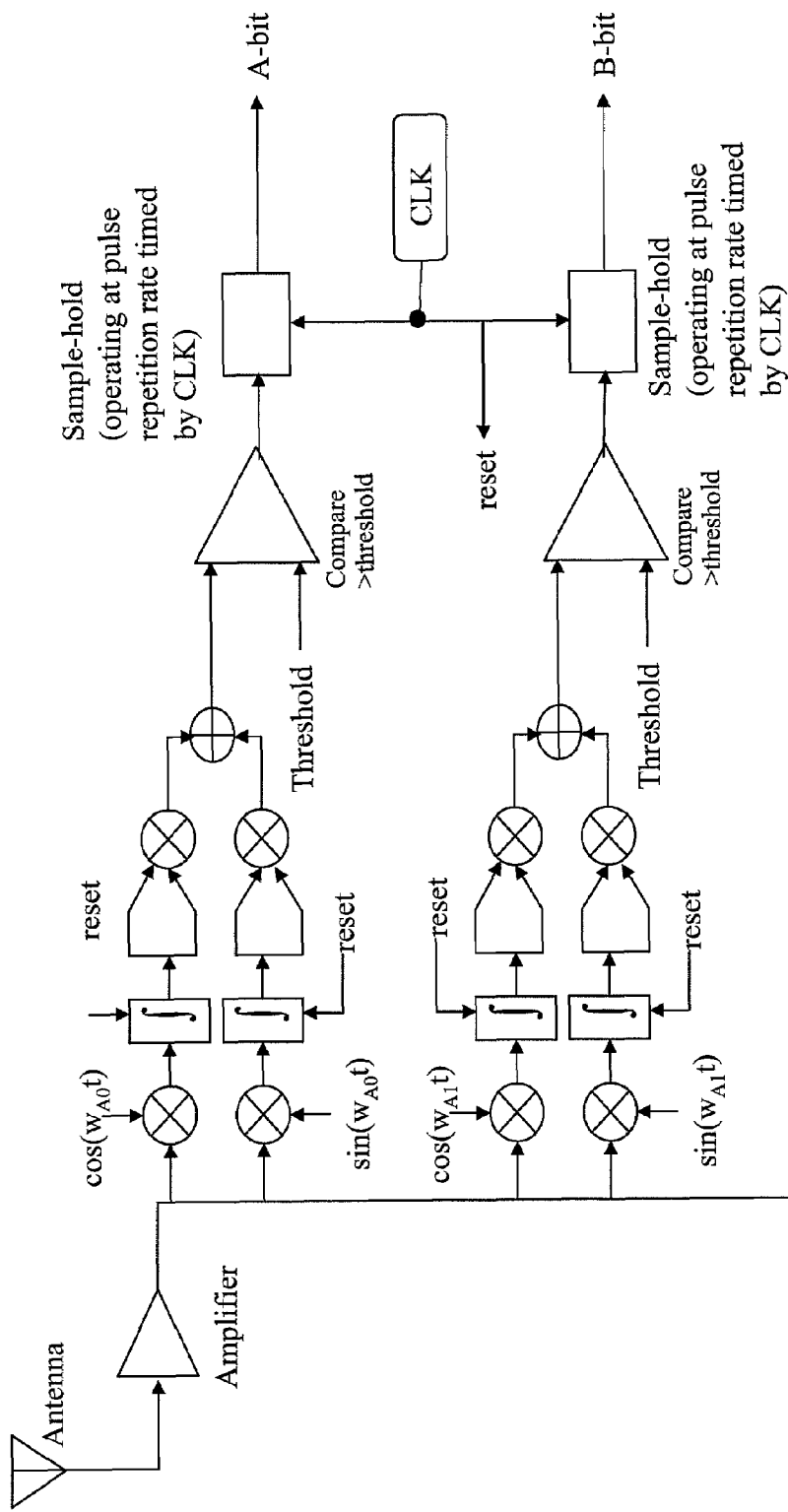
FIG. 28 shows a schematic of a method of detection of bits encoded by notched frequency bands in a Gaussian pulse according to an embodiment of the invention.
Figure 29:
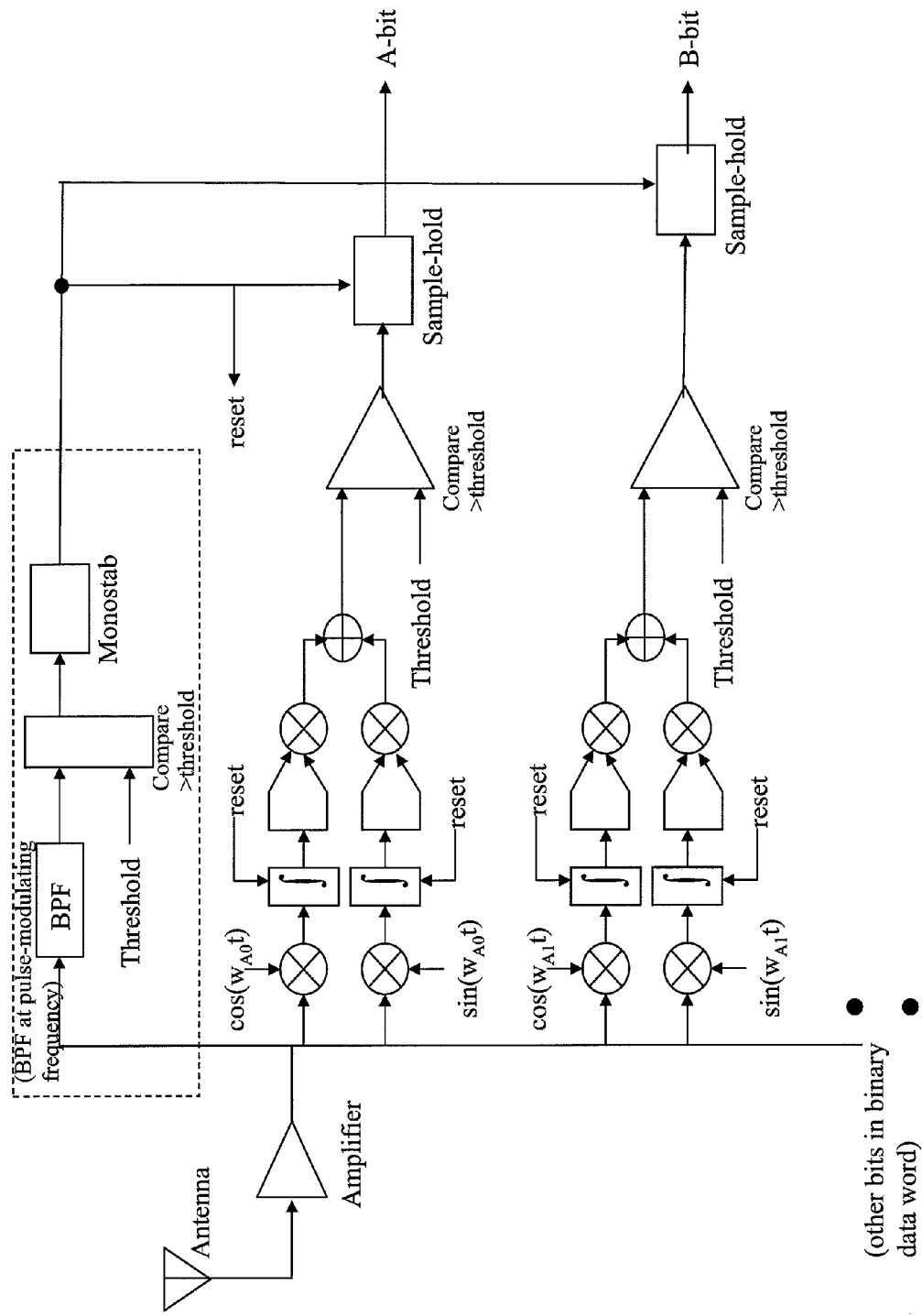
FIG. 29 shows a schematic of a method of detection of bits encoded by notched frequency bands in a Gaussian pulse according to an embodiment of the invention.
Figure 30:
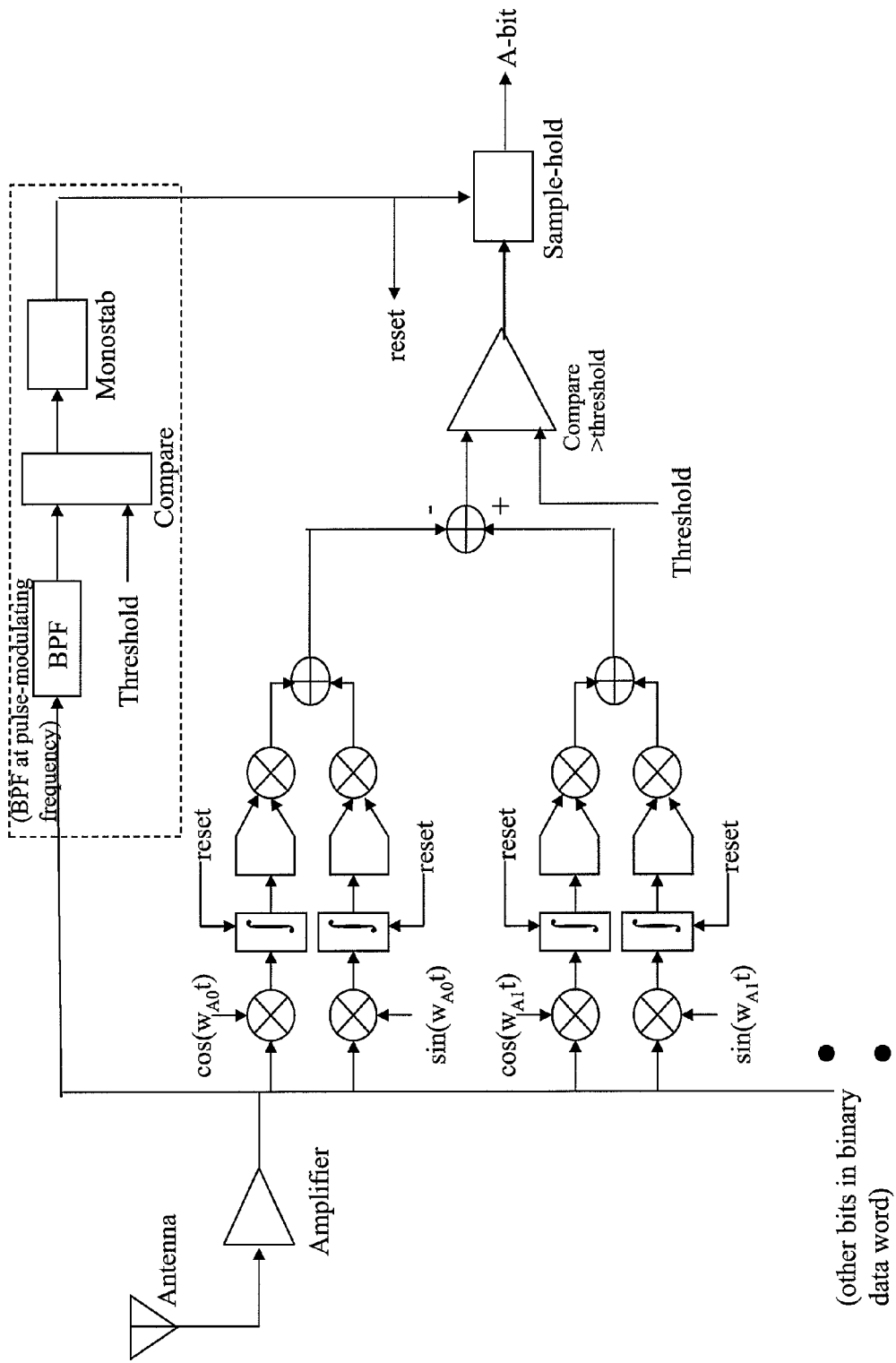
FIG. 30 shows a schematic of a method of detection of bits encoded by antipodal notched pairs of frequency bands in a Gaussian pulse according to an embodiment of the invention.
Figure 31:
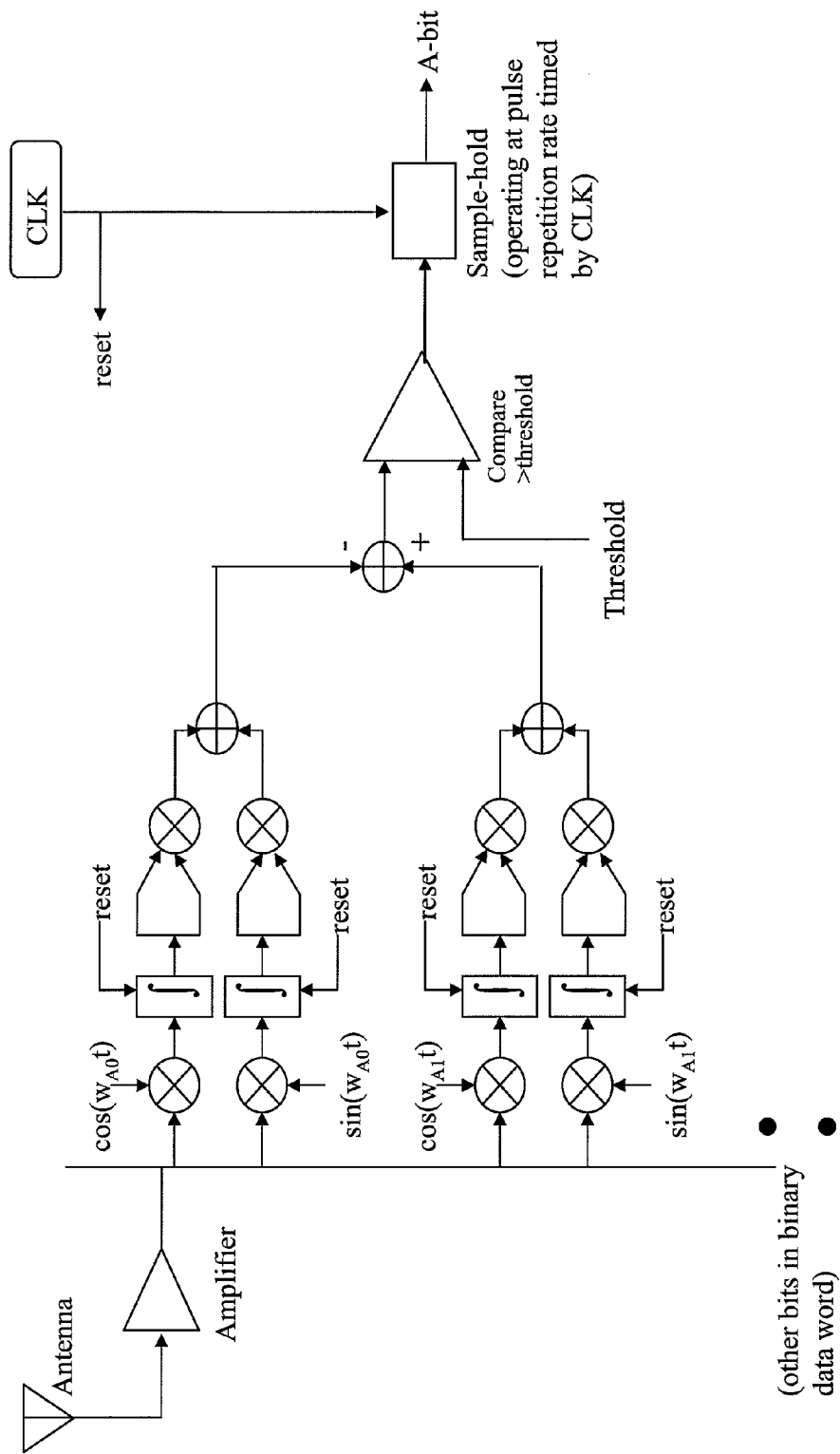
FIG. 31 shows a schematic of a method of detection of bits encoded by antipodal notched pairs of frequency bands in a Gaussian pulse according to an embodiment of the invention.

FIGS. 28 and 29 show schematic descriptions of detectors according to embodiments of the invention that correspond to a single frequency band per bit scheme as illustrated in FIG. 3. In these examples, correlation is performed by mixing the received signal with a sinusoid and integrating over a burst period. In a detector as shown in FIG. 28, the sample-and-hold blocks are latched and the integrators are reset according to a clock signal (e.g. at the burst repetition rate). In a detector as shown in FIG. 29, the sample-and-hold blocks are latched and the integrators are reset according to the burst repetition rate as determined from the received stream of bursts by a rate recovery circuit. In this example, the rate recovery circuit includes a bandpass filter, a comparator, and a monostable multivibrator (one-shot), which changes to an unstable state for a certain time period following a trigger event. FIGS. 30 and 31 show similar detectors for an antipodal scheme as described and illustrated in FIGS. 20 and 26.

In a detection scheme according to another embodiment of the invention, simple asynchronous multiplication by running sinusoids (without time-windowing and integration) is followed by rectification and low-pass filtering to detect the envelope of the pulse. In still another embodiment, synchronous sinusoidal demodulation can be applied if phase information is supplied or known to the receiver. While the frequency notching approach is vulnerable to interference from specific narrowband sources localized at the notch frequencies, synchronizing the detection window with the expected location of a pulse decreases the probability of error due to such interference.

The effect of narrowband interference can also be mitigated by real-time adaptive modification of the notch frequencies. For example, periodic monitoring (at a rate of e.g. 100 times per second) of all (or a selected subset of) notch bands while frequency-notched transmission is momentarily suspended may help to identify the presence of large-amplitude interference and be used to guide a corresponding change in the use of any compromised bands. Possible responses to such interference include shifting to alternate notch frequencies to encode the data previously represented by the compromised bands, modification of the shape of the notch filters themselves to avoid the interference signals, or explicit removal of an interference signal which can be characterized in detail and/or which is much narrower in bandwidth than the notch band.

Multipath reflections can also degrade performance, since the resulting interference can introduce localized spectral attenuation which may be interpreted by the detection scheme as a frequency notch which encodes data. Channel sounding provides one method of identifying such multipath-induced spectral modification. For example, a diagnostic sounding burst without frequency notches can be generated periodically (e.g. 100 times per second) and the resulting received pulse spectrum analyzed for the presence of attenuation in the specified notch bands produced by channel features. Identification of the presence of such attenuation can produce an adaptive response similar to that used for narrowband interference mitigation as described above (e.g. shifting of the notch frequencies to alternate bands away from the multipath-affected bands). Other methods specific to multipath effect mitigation can also be used. For example, modification of pulse repetition rate can be effective to reduce long path length interference, while the width of the pulse window can be adjusted to reduce short path length interference. In another example, channel sounding as described herein may be performed to obtain a characterization of a particular site, which characterization may be stored and applied at a later time to guide transmission by notched RF bursts.

The frequency content of the frequency notched pulse can be detected by filtered reception. In a detection scheme according to another embodiment of the invention, a detailed image of the notched pulse waveforms is correlated with the received signal to provide a matched filter.

Notched pulses essentially consist of the original (unnotched) pulse superimposed with a negative image of the notched component of the pulse. Owing to the causal and physical phase delay intrinsic to realizable filters, the notched component is a slightly delayed resonant pulse waveform which follows the original pulse. In another embodiment, therefore, the original pulse is detected first, and the detection is used to trigger the detection of the following resonant pulse waveform.

Figure 32:
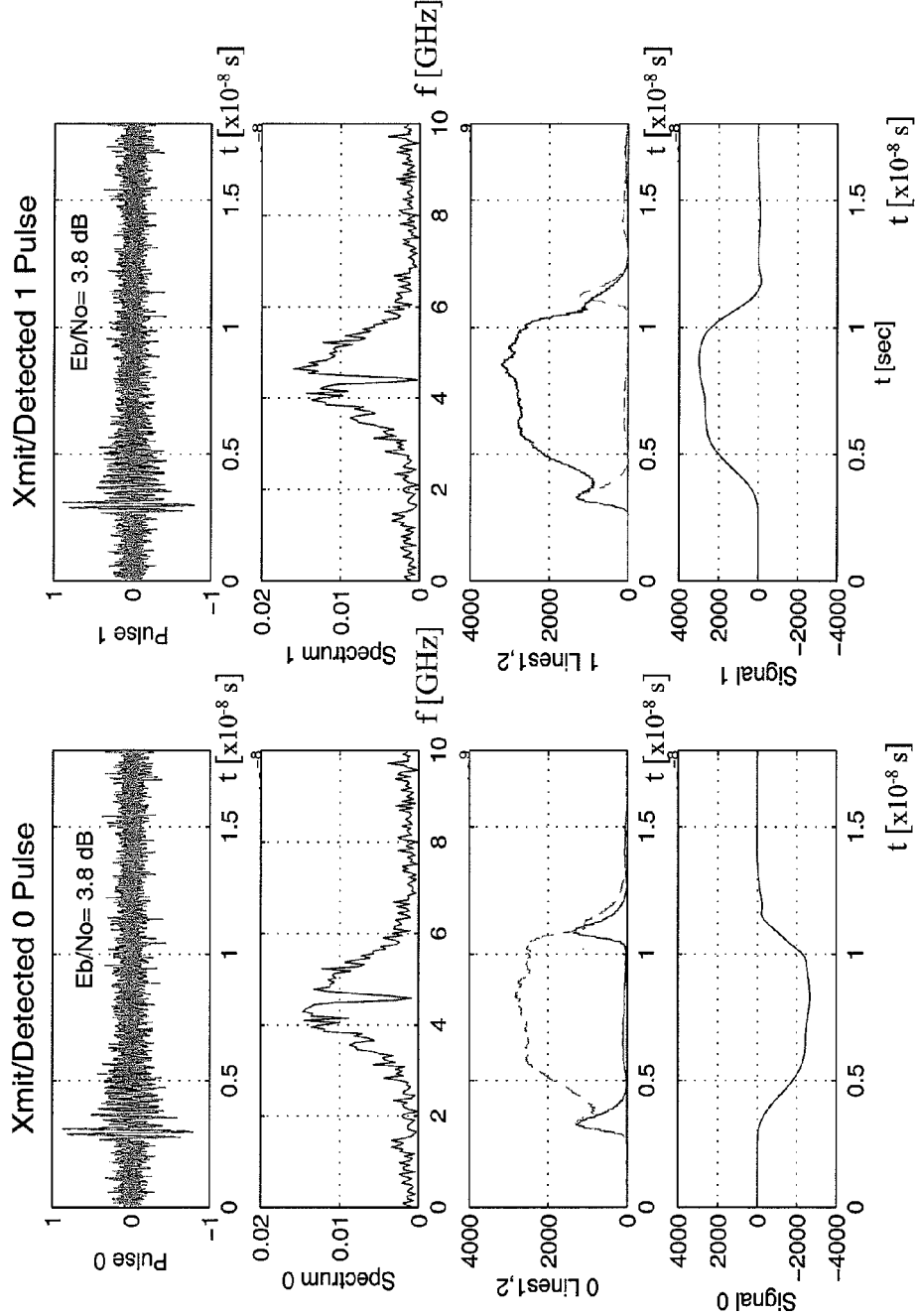
FIG. 32 illustrates detection of frequency notching-encoded bits in the presence of noise (Eb/No=4 dB).
Figure 33:
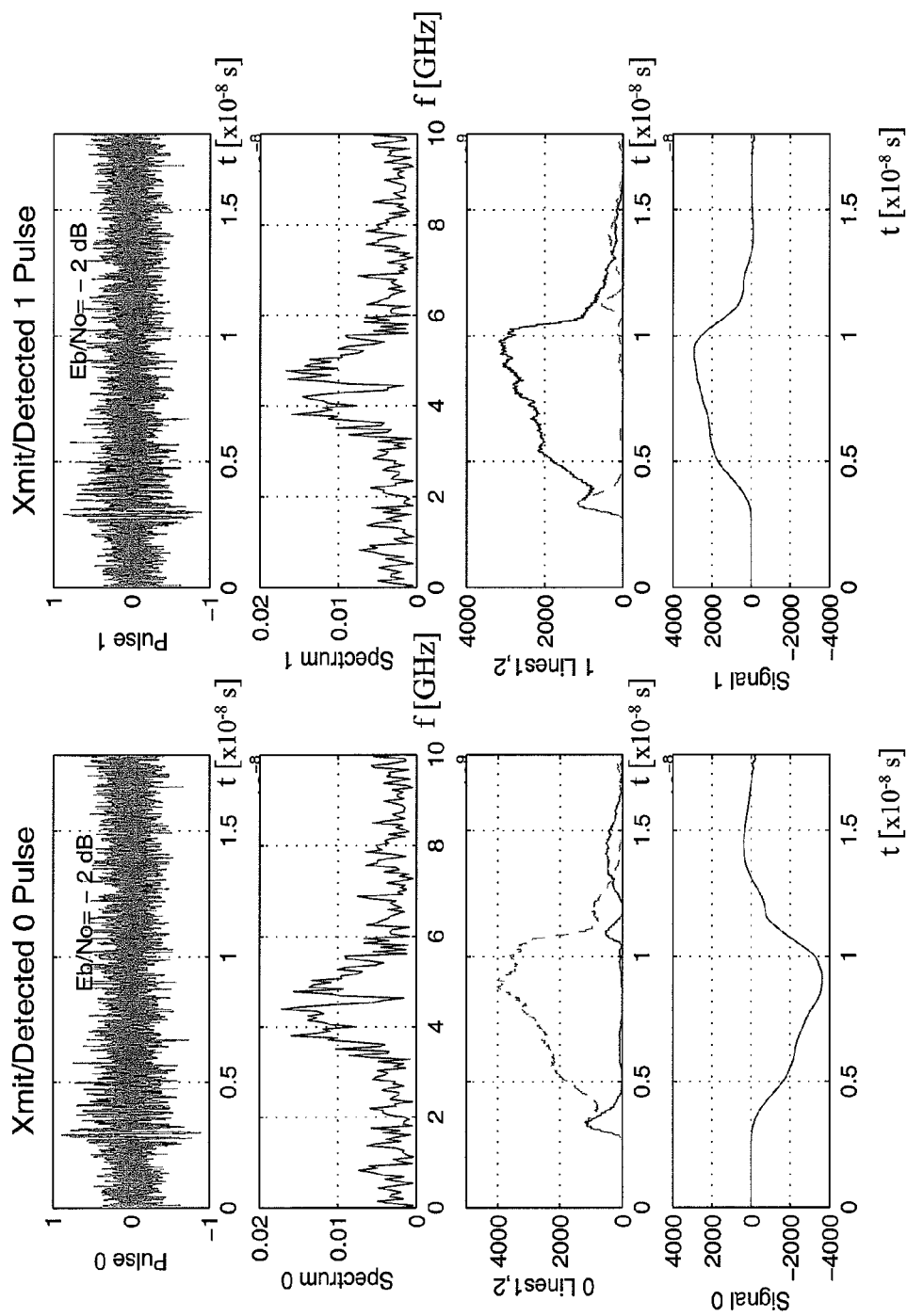
FIG. 33 illustrates detection of frequency notching-encoded bits in the presence of noise (Eb/No=2 dB).

The presence of noise increases the probability of error in detection. FIG. 32 shows a simulation of a detection applied to an antipodal scheme as shown in FIG. 20, but with additive white Gaussian noise (AWGN) having an energy over the burst interval which is .about.40% of the burst energy (thus Eb/No=4 dB in the binary signaling example illustrated). FIG. 33 shows the same type of simulation for Eb/No=2 dB.

Figure 34:
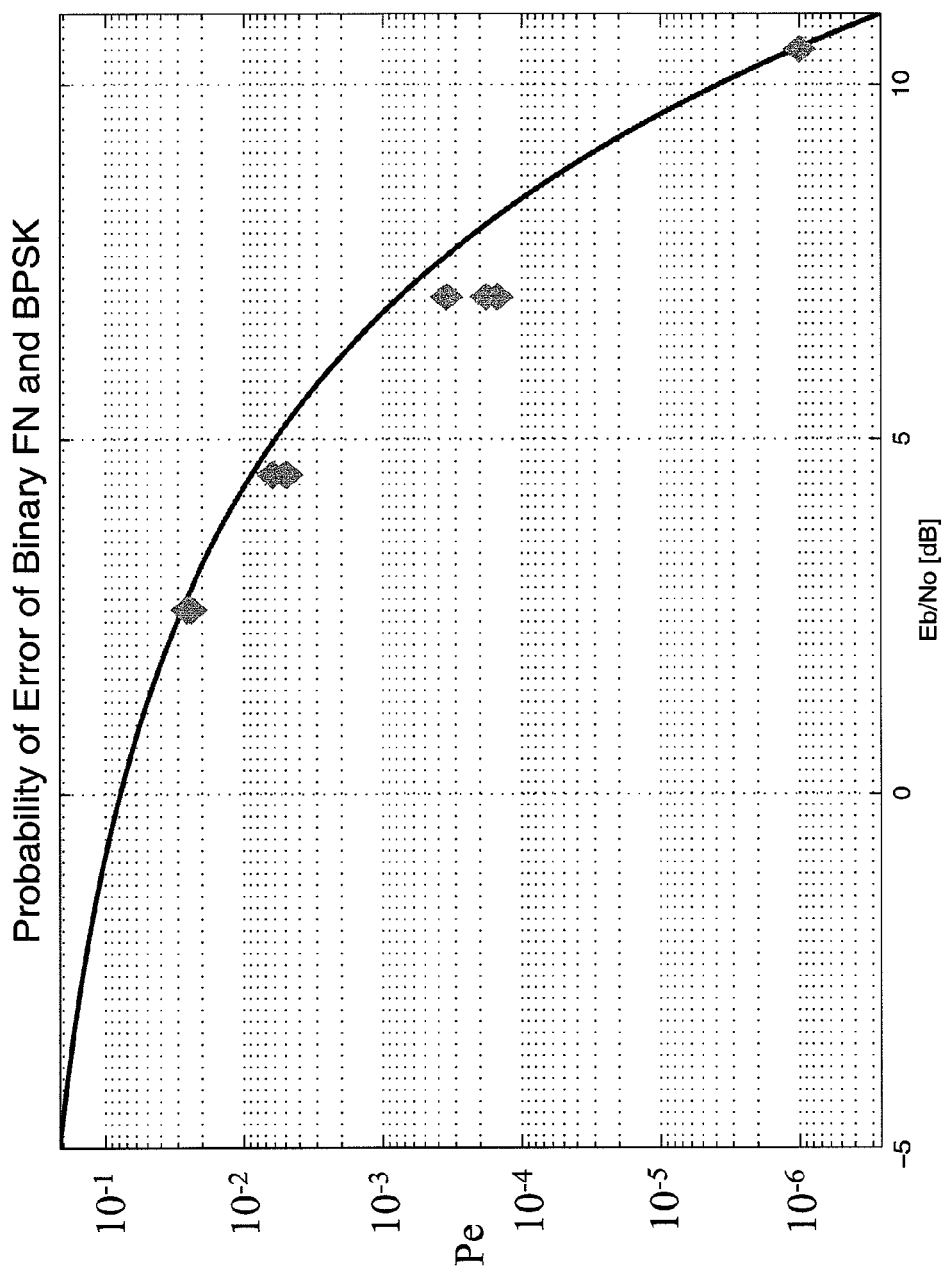
FIG. 34 shows the probability of error for encoding and detection of a single bit in a Gaussian pulse as a function of Eb/No.

FIG. 34 shows the probability of error for encoding and detection of a single bit in a Gaussian pulse as a function of Eb/No, determined from simulation of the detection procedure illustrated in FIG. 26. The empirical data is compared with the performance of a reference antipodal binary signaling scheme (such as binary phase shift keying, or BPSK). The binary signaling antipodal frequency notching scheme is very robust to noise owing to the partial subtraction of noise energy in one frequency band from noise energy in another.

Various coding schemes as known in the art may be used to improve the probability of error over this fundamental result. For example, the large number of bits which can be accommodated in frequency notched pulses (.about.B/(2.DELTA.B) for orthogonal signaling (i.e. signaling using one notch band per bit) and .about.B/(4.DELTA.B) for antipodal signaling, where B is the bandwidth of the initial pulse and .DELTA.B is the notch filter width) can support high redundancy useful for implementing a block coding scheme. One embodiment includes use of bits encoded by frequency notching to implement some form of channel coding scheme (for example, block, convolutional, or turbo coding).

Figure 35:
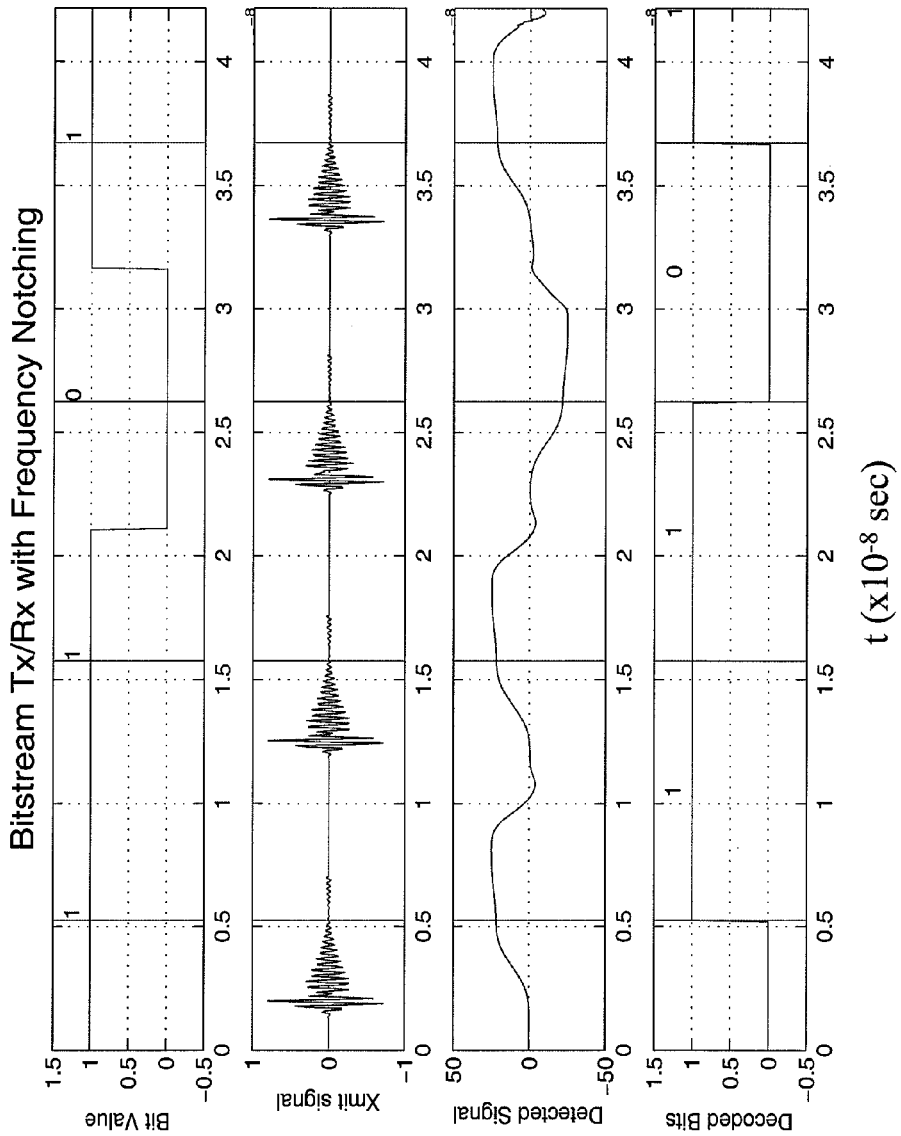
FIG. 35 provides a summary of encoding, pulse generation, demodulation, and detection of an example bit stream in one embodiment of the invention (without noise).
Figure 36:
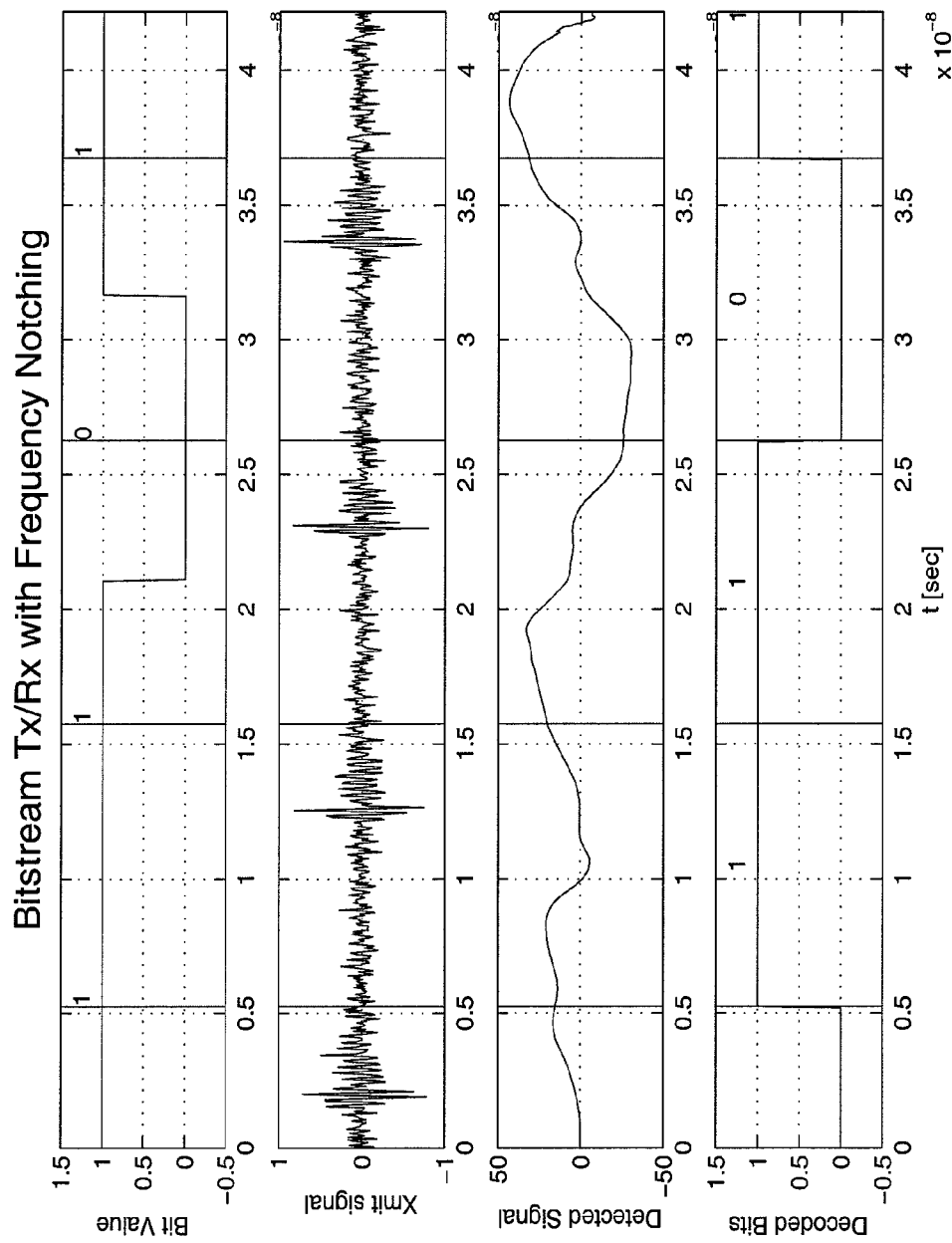
FIG. 36 provides a summary of encoding, pulse generation, demodulation, and detection of an example bit stream in one embodiment of the invention (in the presence of noise with Eb/No=5 dB).

FIG. 35 shows a complete simulation of a simple bit stream encoded using binary signaling with antipodal frequency notching according to one embodiment of the invention. The encoded pulses are assumed transmitted and received electromagnetically. Signal detection is accomplished by correlation of the resulting pulse with quadrature phase sinusoids, squaring, summing, and integrating the result. The demodulated bit stream resulting from a sample-and-hold with maximum likelihood threshold set at 0 is shown in the final frame, reproducing the initial bit data stream (red lines mark the sampling points). FIG. 36 shows the same simulation as that illustrated in FIG. 21, but with noise added (Eb/No=5 dB).

A scheme that maximizes data transfer rate and information density per symbol may be adopted for a noise-free application, while a scheme that maximizes symbol tracking performance at the expense of information density may be adopted for an asynchronous application, and a scheme that balances data transfer rate and error detection capability may be adopted for another application.

It may be desirable to limit the spectral content of a pulse. For example, reducing out-of-band emissions may support a more efficient use of bandwidth. Reducing out-of-band emissions may also be desired to avoid interference with other devices and/or required for regulatory compliance. While a filter may be used to modify the spectral content of a pulse, it may also be desirable to modify the spectral content of a pulse by controlling its shape in the time domain instead.

A sufficiently broad spectrum (i.e. a sufficiently narrow original pulse) can accommodate a large number of encoded bits in a single pulse, providing high bit per burst density and allowing application of sophisticated, long word-length encryption schemes and/or forward error correction codes. Such encoding of information through frequency notching of wideband signals is not limited to Gaussian waveforms, nor to ultra-wideband spectra in particular, but can be applied to any burst having sufficient spectral content to accommodate one or more notches.

Symbols not used for data communications can be used to help determine location and position, and minimize detection errors arising from other emissions (e.g. other ultra-wideband signals), as the symbols can serve as information content to identify specific reference signals sent from known systems. Location determination can be readily achieved by time of flight ranging and triangulation, embedded time stamping, and/or by embedding of transmitter-local GPS data in the message. Measured time of flight must be adjusted for known circuit latency in both transmitter and receiver. Frequency-notched waveforms can be readily used to embed such additional symbols, yet increase the difficulty of unintended observers intercepting and interpreting the pulses, thereby making use of this embedded information.

Certain embodiments of the invention may be applied to decrease the probability of interception and detection by producing waveforms having complex spectra and little a priori apparent structure. Correct detection of such forms of signaling requires a priori knowledge of the location of notched lines and precise information regarding the encoding scheme. The difficulty of determining such characteristics from an intercepted signal may be increased by the use of many frequency bands over a broad spectrum.

Communication with pulses of broad spectral content (narrow temporal extent) intrinsically decreases the probability of interception and detection by conventional narrowband scanning methods. In addition, simple detection of the presence, determination of the salient characteristics, and intentional jamming of such pulses increases in difficulty with decreasing pulse width (increasing spectral content). Similarly, the use of such pulses offers the potential for realization of low power and cost systems. At least some of the methods as disclosed herein may be used to significantly reduce the probability of intercept, power consumption, cost, and jamming susceptibility by exploiting these intrinsic characteristics of pulses with broad spectral content, as well as the particular advantages of the method.

Additionally, use of methods and apparatus for data transfer as described herein may include applications requiring very low cost, robustness to interference and/or multipath, and/or low probability for intercept. Interference and multipath robustness may be especially useful for deployments in industrial settings and military scenarios where jamming (intentional or unintentional) and/or reflections are likely. Low probability for intercept (both in terms of implementing special symbol codes and in terms of possible operations at low emission levels) and low probability for detection are critical components of covert military or sensitive usages.

The foregoing presentation of the described embodiments is provided to enable any person skilled in the art to make or use the present invention. Various modifications to these embodiments are possible, and the generic principles presented herein may be applied to other embodiments as well. Additionally, the principles described herein may be applied to communications over wired or wireless transmission channels.

The invention may be implemented in part or in whole as a hard-wired circuit and/or as a circuit configuration fabricated into an application-specific integrated circuit. The invention may also be implemented in part or in whole as a firmware program loaded into non-volatile storage (e.g. ROM or flash or battery-backup RAM) or a software program loaded from or into a data storage medium (for example, a read-only or rewritable medium such as a semiconductor or ferromagnetic memory (e.g. ROM, programmable ROM, dynamic RAM, static RAM, or flash RAM); or a magnetic, optical, or phase change medium (e.g. a floppy, hard, or CD or DVD disk)) as machine-readable code, such code being instructions executable by an array of logic elements such as a microprocessor or other digital signal processing unit or an FPGA.

In some cases, for example, the design architecture for a data transfer or reception technique according to an embodiment of the invention may be realized in an application-specific integrated circuit (ASIC). Such a design may be implemented as a stand-alone packaged device, or embedded as a core in a larger system ASIC. Features of an architecture according to certain such embodiments of the invention lend themselves well to an ASIC implementation that enables low cost, low power, and/or high volume production. Embodiments of the invention may include designs that are scalable with evolving semiconductor technologies, enabling increased performance objectives and expanded applications. In some cases an entire such architecture may be implemented in a single semiconductor process, although even in these cases it may be possible to transfer the design to multiple semiconductor technologies rather than to depend on a single semiconductor process.

Thus, the present invention is not intended to be limited to the embodiments shown above but rather is to be accorded the widest scope consistent with the principles and novel features disclosed in any fashion herein.

What is claimed is:

1. A transmitter comprising:
   means for generating a RF burst; and
   means for altering, according to at least one data value, at least one of the amplitude and phase of at least one component of the RF burst to produce a notched RF burst,
   wherein a bandwidth of the notched RF burst is at least two percent of the center frequency of the notched RF burst.

2. The transmitter according to claim 1, wherein said means for altering includes means for altering, according to one of the at least one data values, the phase of at least one component of the RF burst.

3. The transmitter according to claim 1, wherein said means for altering includes means for altering, according to one of the at least one data values, the amplitude of at least one component of the RF burst.

4. A transmitter comprising:
   means for generating a plurality of frequency components; and
   means for combining a selected plurality of the plurality of frequency components according to at least one data value to produce a notched RF burst,
   wherein a bandwidth of the notched RF burst is at least two percent of the center frequency of the notched RF burst.

5. The transmitter according to claim 4, wherein at least one of the selected plurality of the plurality of frequency components is a time-limited sinusoid.

6. The transmitter according to claim 4, wherein said means for combining includes means for altering, according to one of the at least one data values, the phase of each of a plurality of selected components.

7. The transmitter according to claim 4, wherein said means for combining includes means for altering, according to one of the at least one data values, the amplitude of each of a plurality of selected components.

8. A data storage medium having machine-readable code stored thereon, the machine-readable code comprising instructions executable by an array of logic elements, the instructions defining a method of data transmission, said method comprising:
   receiving at least one data value to be transferred;
   generating a RF burst; and
   altering, according to the at least one data value, at least one of the amplitude and phase of at least one component of the RF burst to produce a notched RF burst,
   wherein a bandwidth of the notched RF burst is at least two percent of the center frequency of the notched RF burst.

9. A data storage medium having machine-readable code stored thereon, the machine-readable code comprising instructions executable by an array of logic elements, the instructions defining a method of data transmission, said method comprising:
   generating a plurality of frequency components; and
   combining a selected plurality of the frequency components according to at least one data value to produce a notched RF burst,
   wherein a bandwidth of the notched RF burst is at least two percent of the center frequency of the notched RF burst.

10. A transmitter comprising:
    a signal generator configured to generate an RF burst; and
    a burst shaper configured to alter, according to at least one data value, at least one of the amplitude and phase of at least one selected component of the RF burst to form a notched radio-frequency (RF) burst,
    wherein a bandwidth of the notched RF burst is at least two percent of the center frequency of the notched RF burst, and
    wherein each of the at least one selected components has a bandwidth within the bandwidth of the notched RF burst.

11. The transmitter according to claim 10, said transmitter further comprising a sensor configured to sense an environmental condition and to output the at least one data value according to the sensed environmental condition.

12. A system including:
    a plurality of transmitters, each of the plurality of transmitters comprising:
    a sensor configured to sense an environmental condition and to output a set of at least one data value according to the sensed environmental condition;
    a signal generator configured to generate an RF burst; and
    a burst shaper configured to alter, according to the set of at least one data value, at least one of the amplitude and phase of at least one selected component of the RF burst to form a notched radio-frequency (RF) burst; and
    a receiver configured to receive the notched RF bursts from each transmitter, to decode the corresponding sets of data values, and to associate each among the sets with a location of the corresponding transmitter,
    wherein a bandwidth of each notched RF burst is at least two percent of the center frequency of the notched RF burst, and
    wherein each of the at least one selected components has a bandwidth within the bandwidth of the corresponding notched RF burst.

13. The system according to claim 12, wherein at least one among said plurality of transmitters is further configured to transmit a second plurality of bursts indicating at least one parameter selected from a group consisting of: a location and a position of said transmitter.

* * * * *

UNITED STATES PATENT AND TRADEMARK OFFICE
CERTIFICATE OF CORRECTION

| | | |
|---|---|---|
| PATENT NO. | : 7,656,963 B2 | Page 1 of 1 |
| APPLICATION NO. | : 11/669027 | |
| DATED | : February 2, 2010 | |
| INVENTOR(S) | : Humphreys et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 165 days.

Signed and Sealed this

Thirtieth Day of November, 2010

David J. Kappos
*Director of the United States Patent and Trademark Office*